(12) United States Patent
Earon

(10) Patent No.: US 8,991,758 B2
(45) Date of Patent: Mar. 31, 2015

(54) UNMANNED AERIAL VEHICLE

(71) Applicant: Winehawk Inc., Thornhill (CA)

(72) Inventor: Ernest Earon, Thornhill (CA)

(73) Assignee: Precisionhawk Inc., Thornhill (CA)

( * ) Notice: Subject to any disclaimer, the term of this patent is extended or adjusted under 35 U.S.C. 154(b) by 61 days.

(21) Appl. No.: 13/892,358

(22) Filed: May 13, 2013

(65) Prior Publication Data

US 2014/0332620 A1 Nov. 13, 2014

(51) Int. Cl.
*B64C 1/00* (2006.01)
*B64C 39/02* (2006.01)
*B64D 47/08* (2006.01)

(52) U.S. Cl.
CPC ............... *B64C 39/024* (2013.01); *B64C 1/00* (2013.01); *B64D 47/08* (2013.01)
USPC .................................. 244/119; 244/2; 701/3

(58) Field of Classification Search
USPC ........ 244/119, 2, 1 R, 117 R, 120; 701/3, 14; 361/748; 307/9.1
See application file for complete search history.

(56) References Cited

U.S. PATENT DOCUMENTS

| | | | |
|---|---|---|---|
| 743,301 A | 11/1903 | Lischtiak | |
| 1,507,192 A | 9/1924 | Laukandt | |
| D132,383 S | 12/1940 | Reedy | |
| 2,762,590 A | 9/1956 | Huie | |
| 3,787,998 A | 1/1974 | Kilroy et al. | |
| 3,839,818 A | 10/1974 | Heggedal | |
| 4,863,413 A | 9/1989 | Schwarz | |
| 4,911,384 A | 3/1990 | Stankus | |
| 5,150,860 A | 9/1992 | Young | |
| 5,524,851 A | 6/1996 | Huang | |
| 5,609,312 A * | 3/1997 | Arlton et al. | 244/17.11 |
| 5,836,545 A | 11/1998 | Arlton et al. | |
| 6,095,458 A | 8/2000 | Cripe | |
| 6,142,419 A | 11/2000 | Arlton | |
| 6,520,823 B2 | 2/2003 | Tian et al. | |
| 6,615,165 B2 | 9/2003 | Carroll | |
| 6,742,741 B1 | 6/2004 | Rivoli | |
| D495,376 S | 8/2004 | Zee | |
| 6,868,314 B1 * | 3/2005 | Frink | 701/3 |
| 7,059,566 B2 * | 6/2006 | Byers et al. | 244/119 |
| 7,073,748 B2 * | 7/2006 | Maurer et al. | 244/1 R |
| 7,168,657 B2 | 1/2007 | Chen | |
| 7,237,750 B2 | 7/2007 | Chiu et al. | |
| 7,391,622 B2 * | 6/2008 | Marshall et al. | 361/804 |
| D581,992 S | 12/2008 | Wang | |
| D585,370 S | 1/2009 | Tu | |
| D596,267 S * | 7/2009 | Colgren et al. | D12/319 |
| D608,268 S | 1/2010 | Iori | |
| D621,774 S | 8/2010 | Betsch | |
| 7,811,151 B2 | 10/2010 | Conrad | |
| D628,528 S | 12/2010 | Cabezas Carrasco | |
| D629,737 S | 12/2010 | Betsch | |

(Continued)

*Primary Examiner* — Christopher P Ellis
(74) *Attorney, Agent, or Firm* — Joseph Conneely; Gowling Lafleur Henderson LLP

(57) ABSTRACT

An unmanned aerial vehicle, comprising: a fuselage having a first side board and a second side board spaced apart and connected by at least one transverse board; the first side board, the second side board, and the at least one transverse board being printed circuit boards; at least one of the first side board, the second side board, and the at least one transverse board having formed and mounted thereon conductive traces and at least one component, respectively, for controlling and monitoring the unmanned aerial vehicle; first and second wings mounted to the fuselage; and, a tail mounted to the fuselage.

21 Claims, 37 Drawing Sheets

(56) References Cited

U.S. PATENT DOCUMENTS

| | | |
|---|---|---|
| 7,922,115 B2 | 4/2011 | Colgren et al. |
| D656,999 S | 4/2012 | Frederick |
| 8,201,773 B1 * | 6/2012 | Durham et al. ............ 244/49 |
| D665,331 S | 8/2012 | Sands |
| 8,242,623 B2 * | 8/2012 | Lucero et al. ............ 307/9.1 |
| D706,678 S | 6/2014 | Earon |
| 2002/0173217 A1 | 11/2002 | Kinkade |
| 2004/0007646 A1 | 1/2004 | Chang |
| 2006/0255209 A1 | 11/2006 | Chen |
| 2008/0125920 A1 * | 5/2008 | Miles et al. ............ 701/2 |
| 2008/0149758 A1 | 6/2008 | Colgren et al. |
| 2010/0120273 A1 * | 5/2010 | Lucero et al. ............ 439/79 |
| 2010/0323579 A1 | 12/2010 | Liang et al. |
| 2012/0209456 A1 | 8/2012 | Harmon et al. |
| 2013/0105628 A1 | 5/2013 | Buscher et al. |

* cited by examiner

UNMANNED AERIAL VEHICLE

FIELD OF THE INVENTION

This invention relates to the field of aerial vehicles, and more specifically, to unmanned aerial vehicles.

BACKGROUND

An unmanned aerial vehicle ("UAV"), unmanned aircraft, or drone, is an aircraft without a human pilot on board. The flight of a UAV may be controlled autonomously by computers on board the UAV or under the remote control of an operator or user on the ground or in another vehicle.

UAVs come in a wide variety of shapes, sizes, and configurations and are used for civil and military applications including farming, surveillance, mapping, policing, firefighting, and security.

In small UAVs, the computational resources required for operation are generally located on the ground. The UAV transmits raw data (e.g., video streams, telemetry information, etc.) to a ground station computer which then processes the raw data. Such UAVs may be stabilised in flight by small flight control systems (e.g., an autopilot) and usually few additional electronic components beyond payload and actuators are provided. Flight control, behaviour, mission planning, and reaction to conditions are performed on the ground, typically by a user. Increasingly, the flight plan of the UAV is generated by the ground station computer based on a bounded area supplied by the user. Diagnostics are the responsibility of the user who needs to monitor weather conditions and sensor readings (e.g., autopilot temperature) and make decisions based on expected thresholds, etc. Moreover, mechanical diagnostics are performed by the user through visual inspection of the UAV's airframe. Thus, one problem with present UAVs relates to their limited self-diagnostic capability.

Another problem with present UAVs relates to their cost. While typically having limited functionality, UAVs are often still too expensive for many applications where they could be usefully deployed.

A need therefore exists for an improved UAV. Accordingly, a solution that addresses, at least in part, the above and other shortcomings is desired.

SUMMARY OF THE INVENTION

According to one aspect of the invention, there is provided an unmanned aerial vehicle, comprising: a fuselage having a first side board and a second side board spaced apart and connected by at least one transverse board; the first side board, the second side board, and the at least one transverse board being printed circuit boards; at least one of the first side board, the second side board, and the at least one transverse board having formed and mounted thereon conductive traces and at least one component, respectively, for controlling and monitoring the unmanned aerial vehicle; first and second wings mounted to the fuselage; and, a tail mounted to the fuselage.

BRIEF DESCRIPTION OF THE DRAWINGS

Features and advantages of the embodiments of the present invention will become apparent from the following detailed description, taken in combination with the appended drawings, in which.

It will be noted that throughout the appended drawings, like features are identified by like reference numerals.

DETAILED DESCRIPTION OF THE EXEMPLARY EMBODIMENTS

In the following description, details are set forth to provide an understanding of the invention. In some instances, certain circuits, structures and techniques have not been described or shown in detail in order not to obscure the invention.

According to one embodiment of the invention, an unmanned aerial vehicle ("UAV") is provided that is constructed from printed circuit boards ("PCBs"). The use of PCBs allows for a larger, improved capability, stronger, less expensive, yet complex UAV to be made. In particular, diagnostics and artificial intelligence may be included in the UAV without the need for extensive wiring. In addition, the use of PCB construction allows for sensors and circuits to be easily placed at the point of need by critical flight control systems and controls in the UAV.

For reference, a PCB is used to mechanically support and electrically connect electronic components using conductive pathways, tracks, or traces etched from copper sheets laminated onto a non-conductive substrate. PCBs are used in most commercially produced electronic devices and allow for fully automated assembly processes. The majority of PCBs are made from laminate material with copper already applied to both sides. The unwanted copper is removed by various methods leaving only the desired conductive copper traces. This is a subtractive method. In an additive method, conductive traces are electroplated onto a bare substrate. Double-sided boards or multi-layer boards use plated-through holes, called vias, to connect traces on different layers of the PCB. After the PCB is completed, electronic components are attached to form a functional PCB assembly. In through-hole construction, component leads are inserted in holes in the PCB. In surface-mount construction, the components are placed on pads or lands on the outer surfaces of the PCB. In both kinds of construction, component leads are electrically and mechanically connected to the board and its traces with a molten metal solder.

Figure 1:
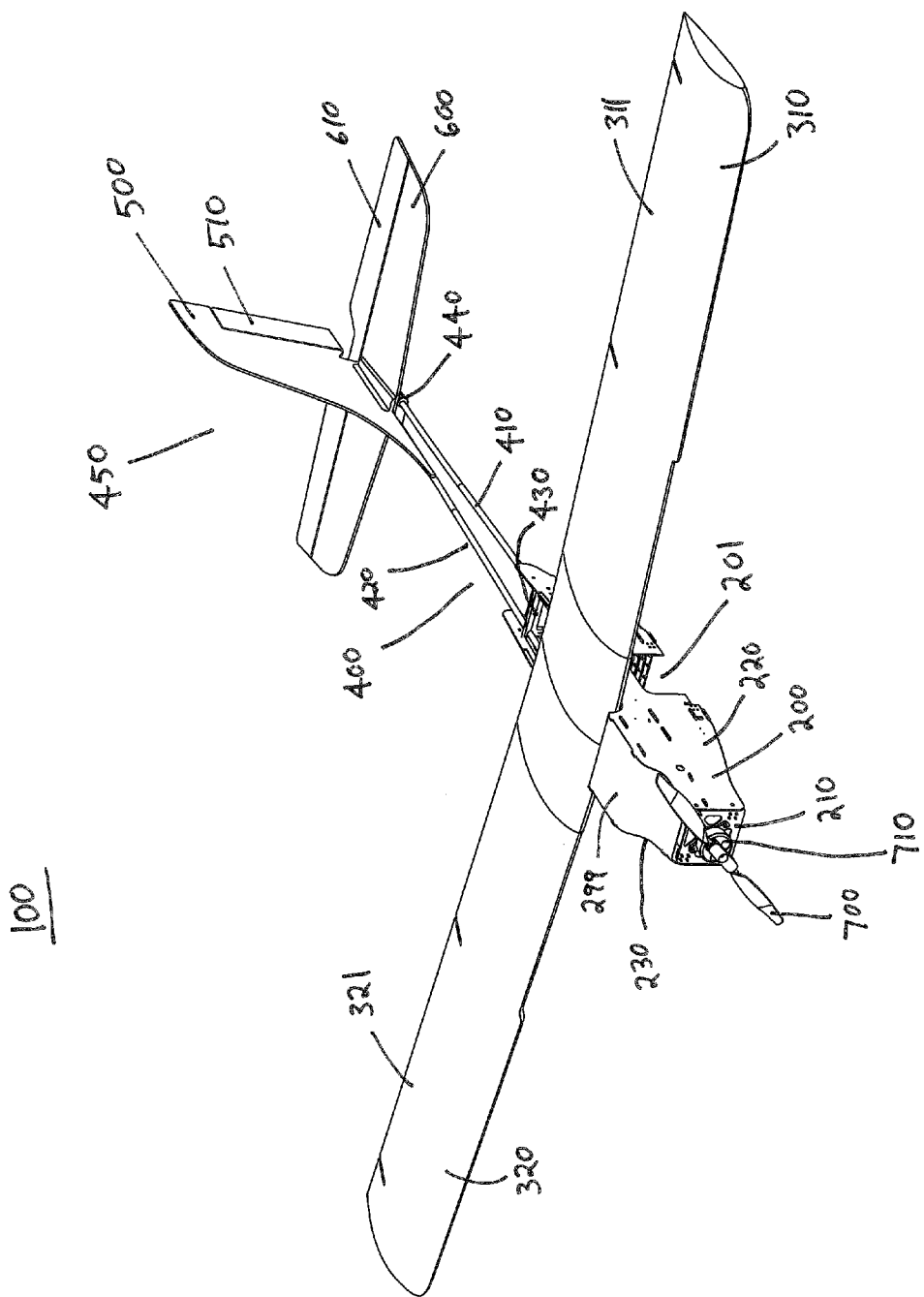
FIG. 1 is front perspective view illustrating an unmanned aerial vehicle ("UAV") in accordance with an embodiment of the invention.
Figure 2:
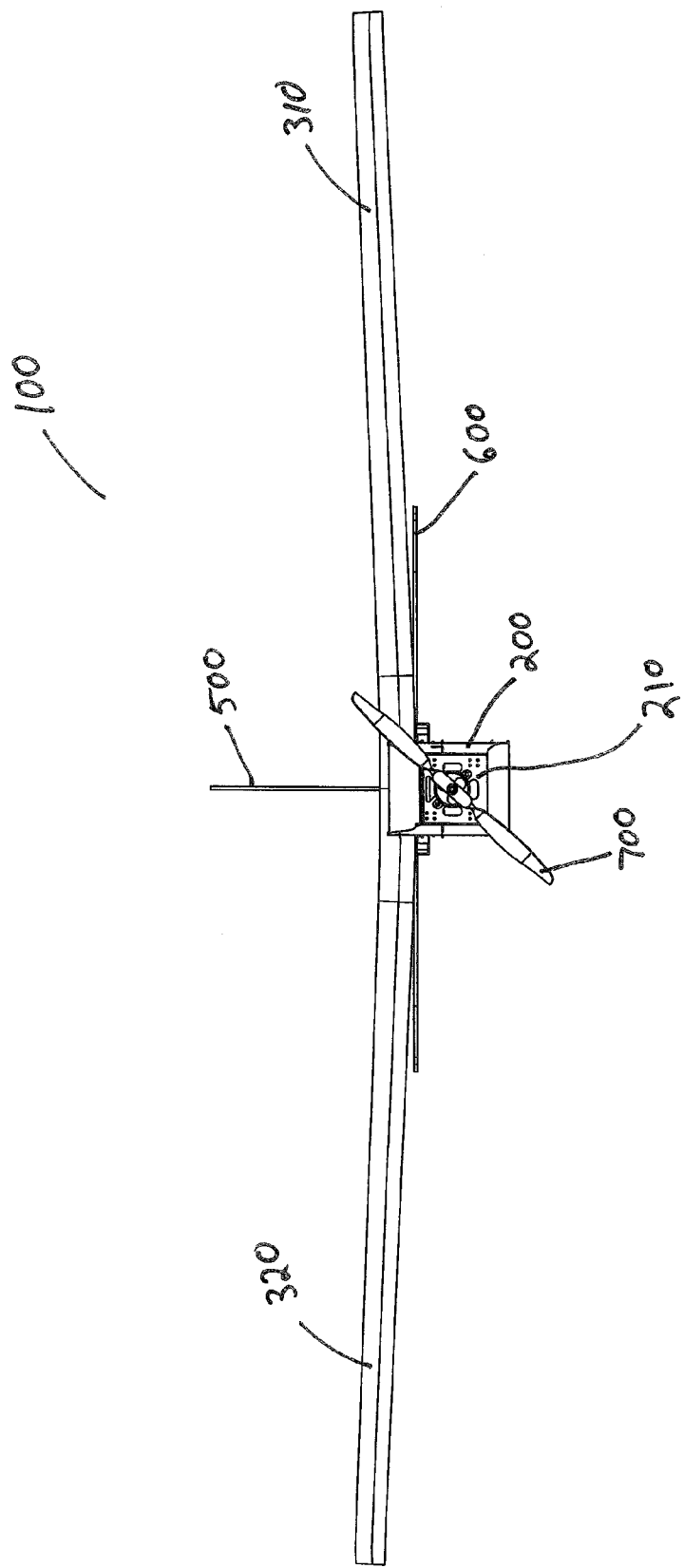
FIG. 2 is a front view of the UAV of FIG. 1 in accordance with an embodiment of the invention.
Figure 3:
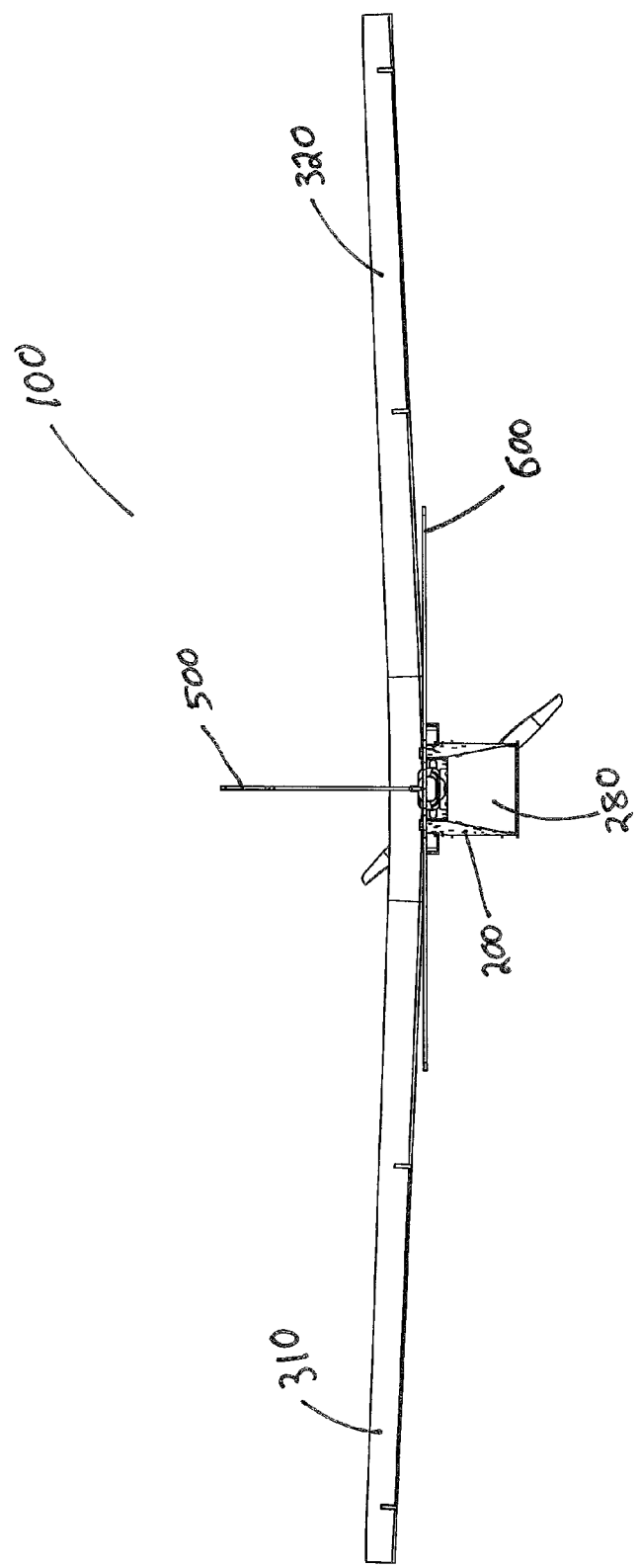
FIG. 3 is a rear view of the UAV of FIG. 1 in accordance with an embodiment of the invention.
Figure 4:
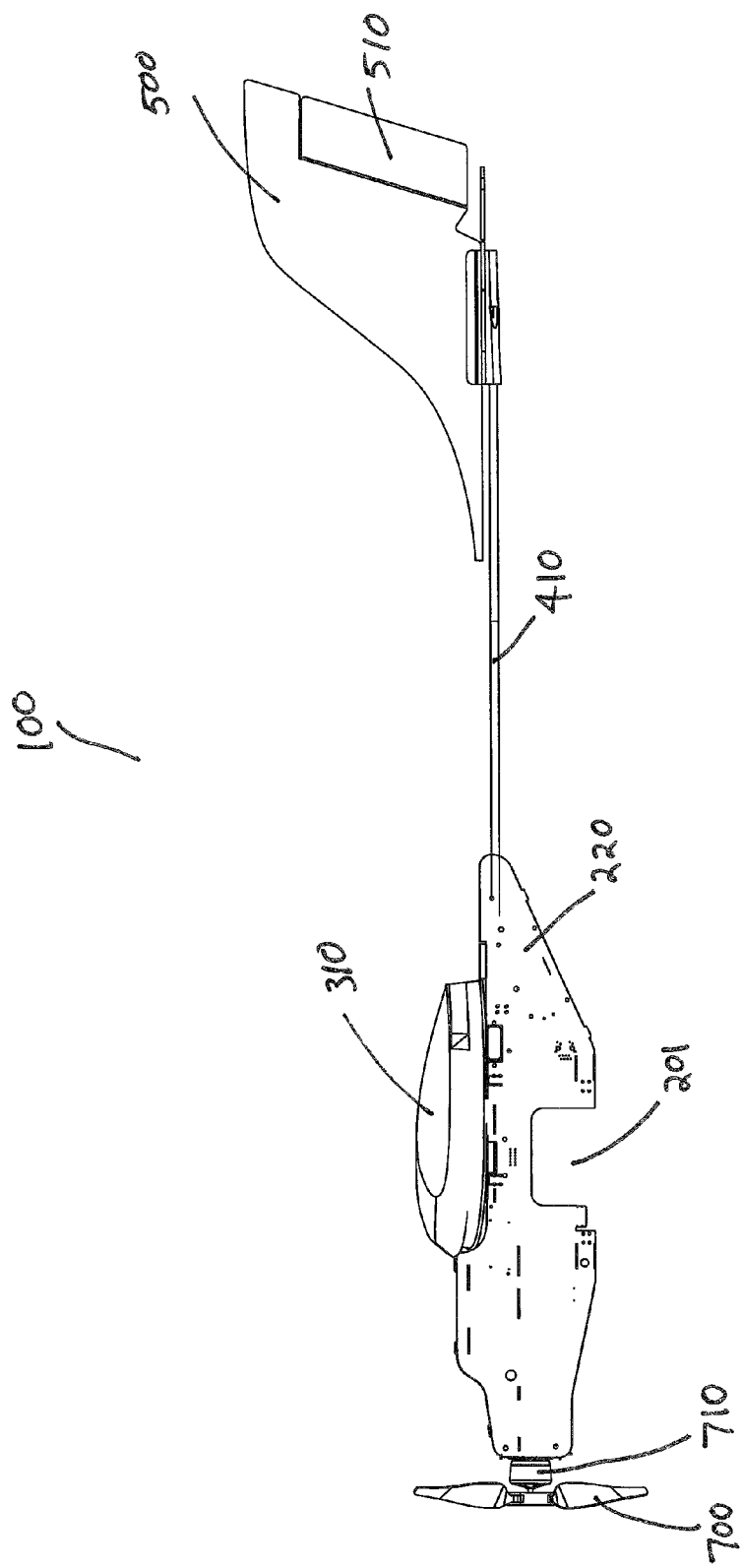
FIG. 4 is a right side view of the UAV of FIG. 1 in accordance with an embodiment of the invention.
Figure 5:
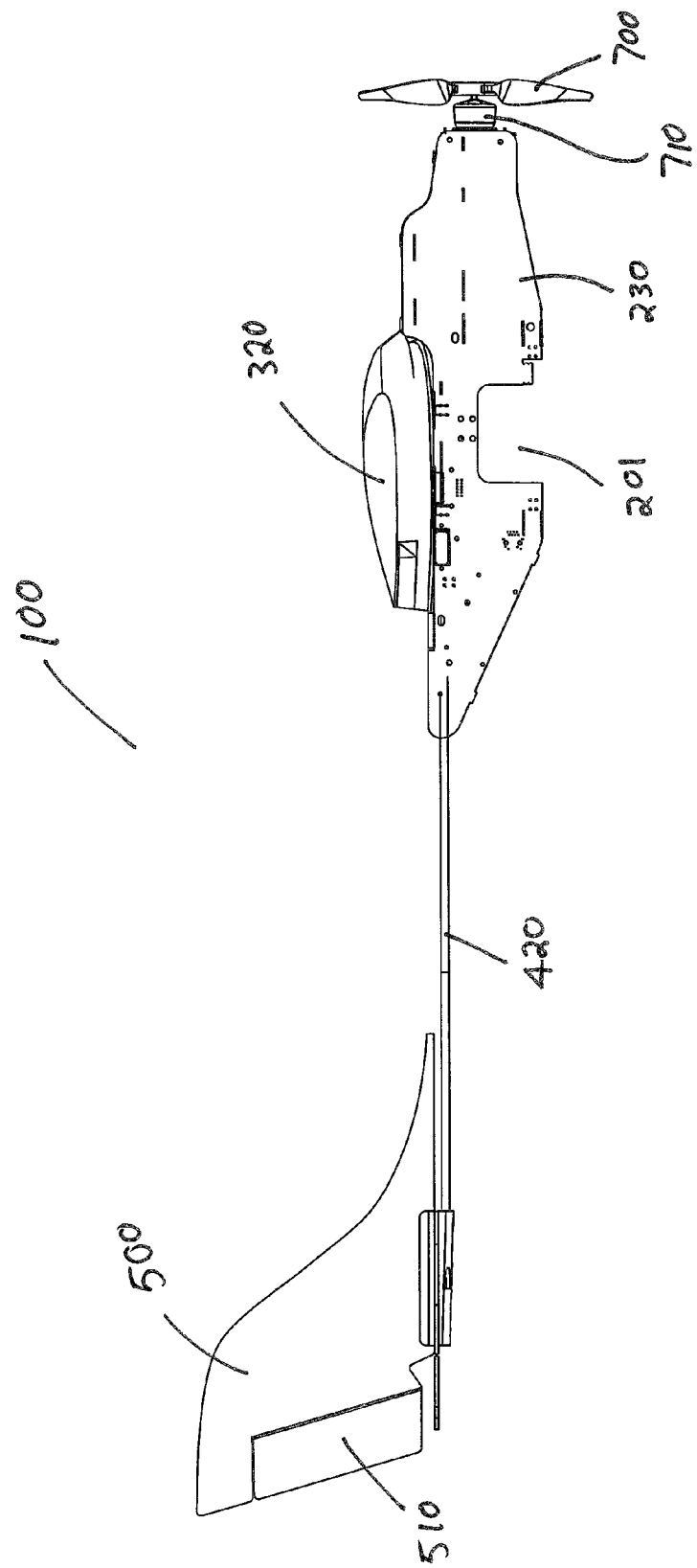
FIG. 5 is a left side view of the UAV of FIG. 1 in accordance with an embodiment of the invention.
Figure 6:
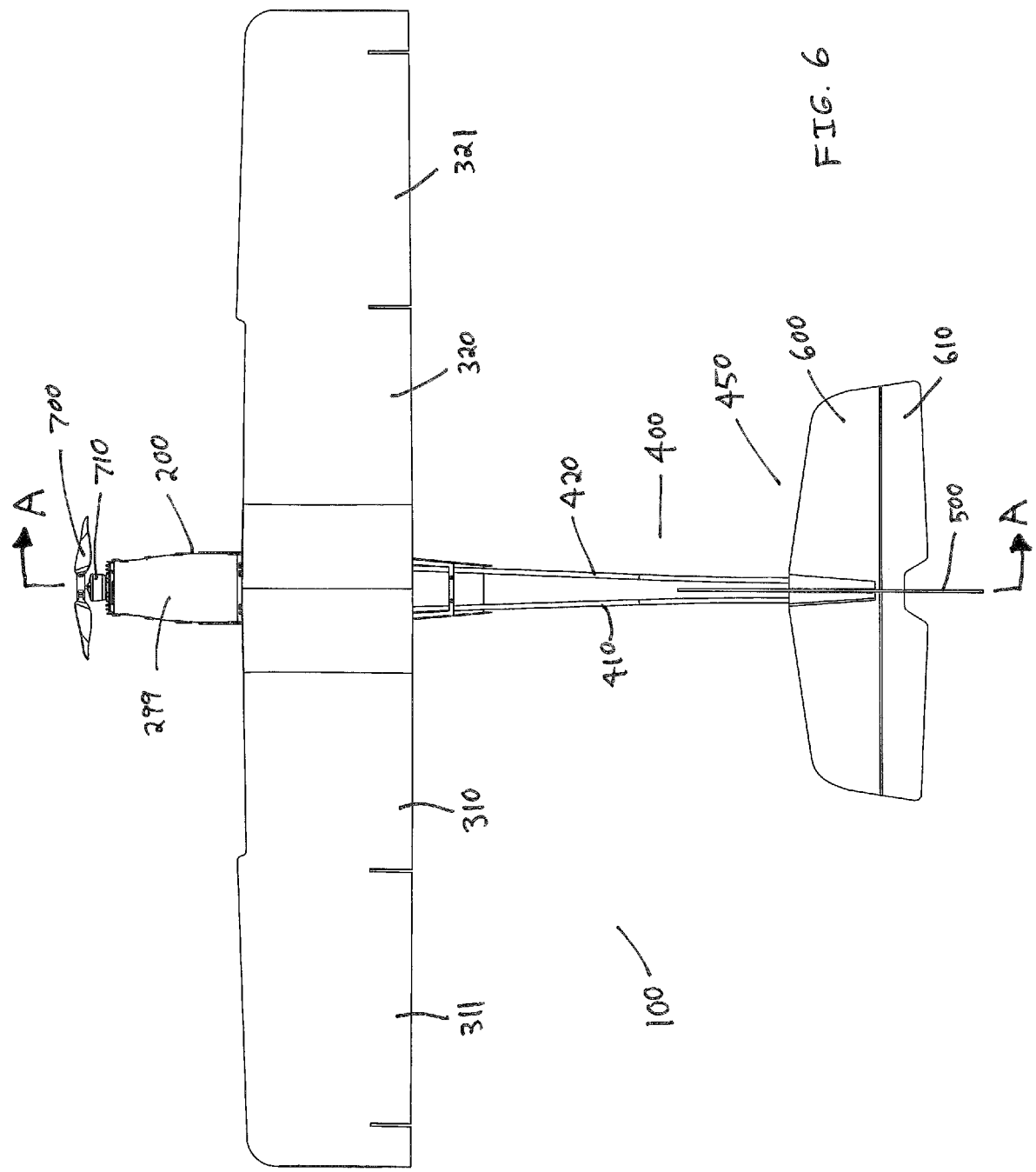
FIG. 6 is a top view of the UAV of FIG. 1 in accordance with an embodiment of the invention.
Figure 7:
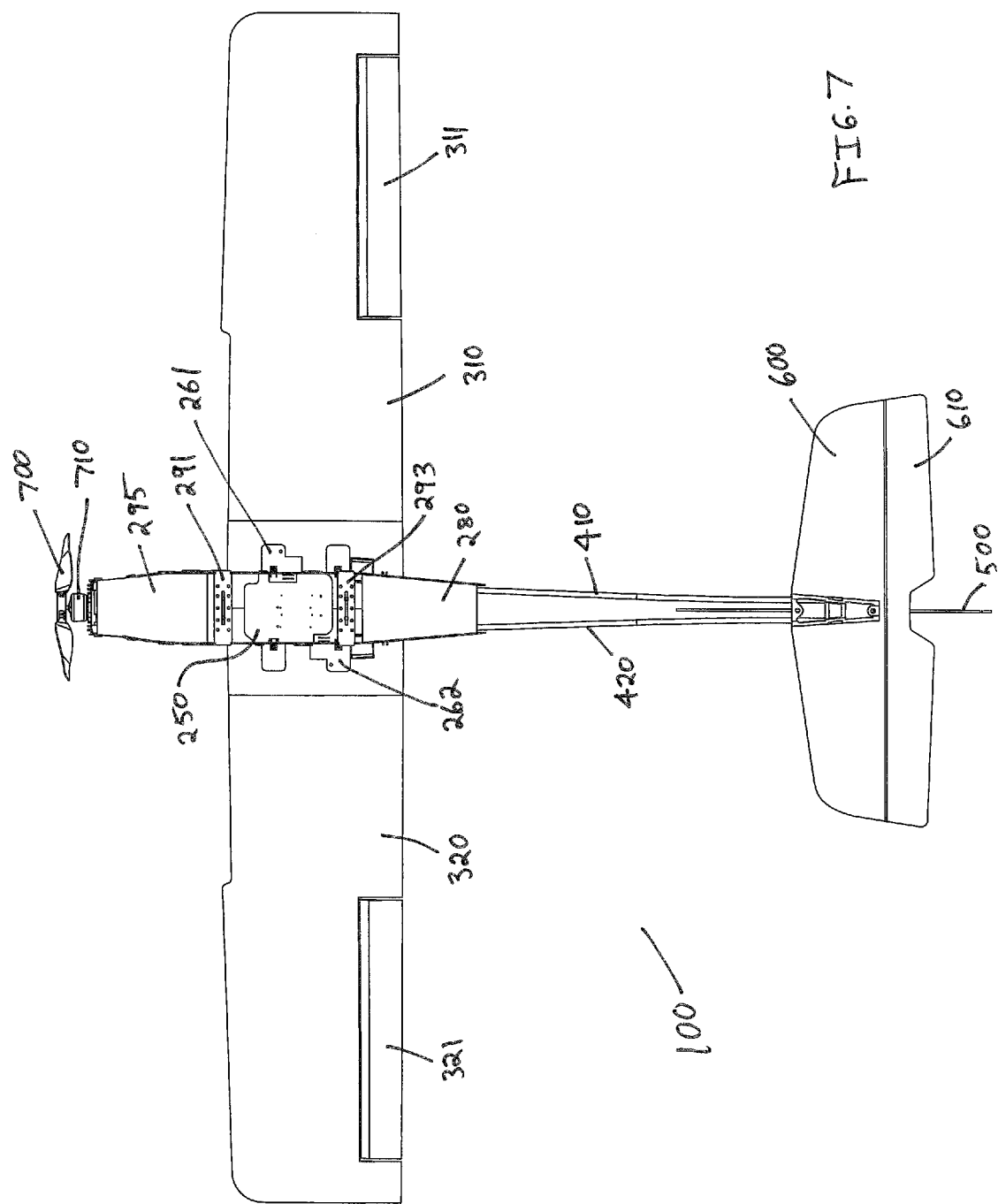
FIG. 7 is a bottom view of the UAV of FIG. 1 in accordance with an embodiment of the invention.
Figure 8:
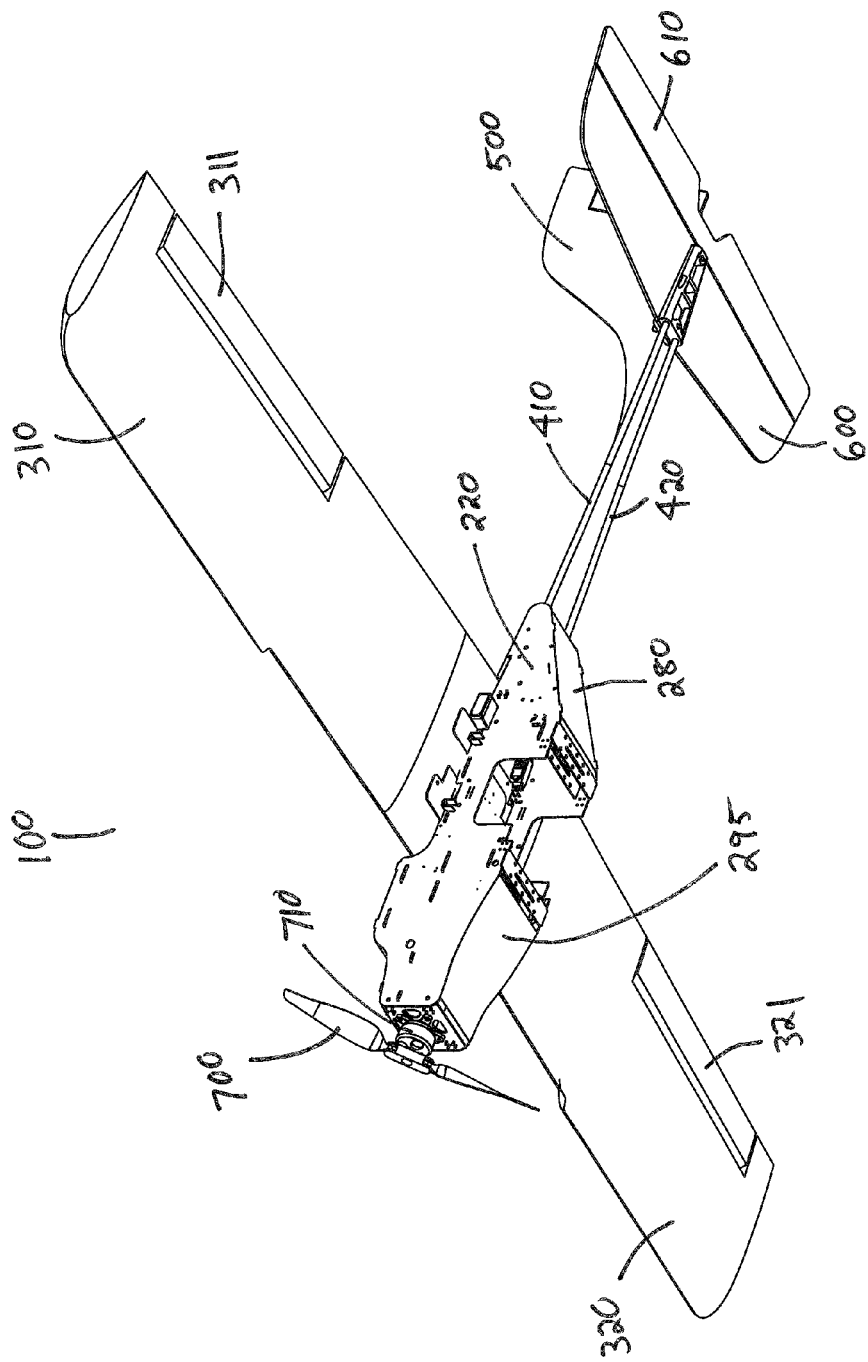
FIG. 8 is a bottom perspective view of the UAV of FIG. 1 in accordance with an embodiment of the invention.
Figure 9:
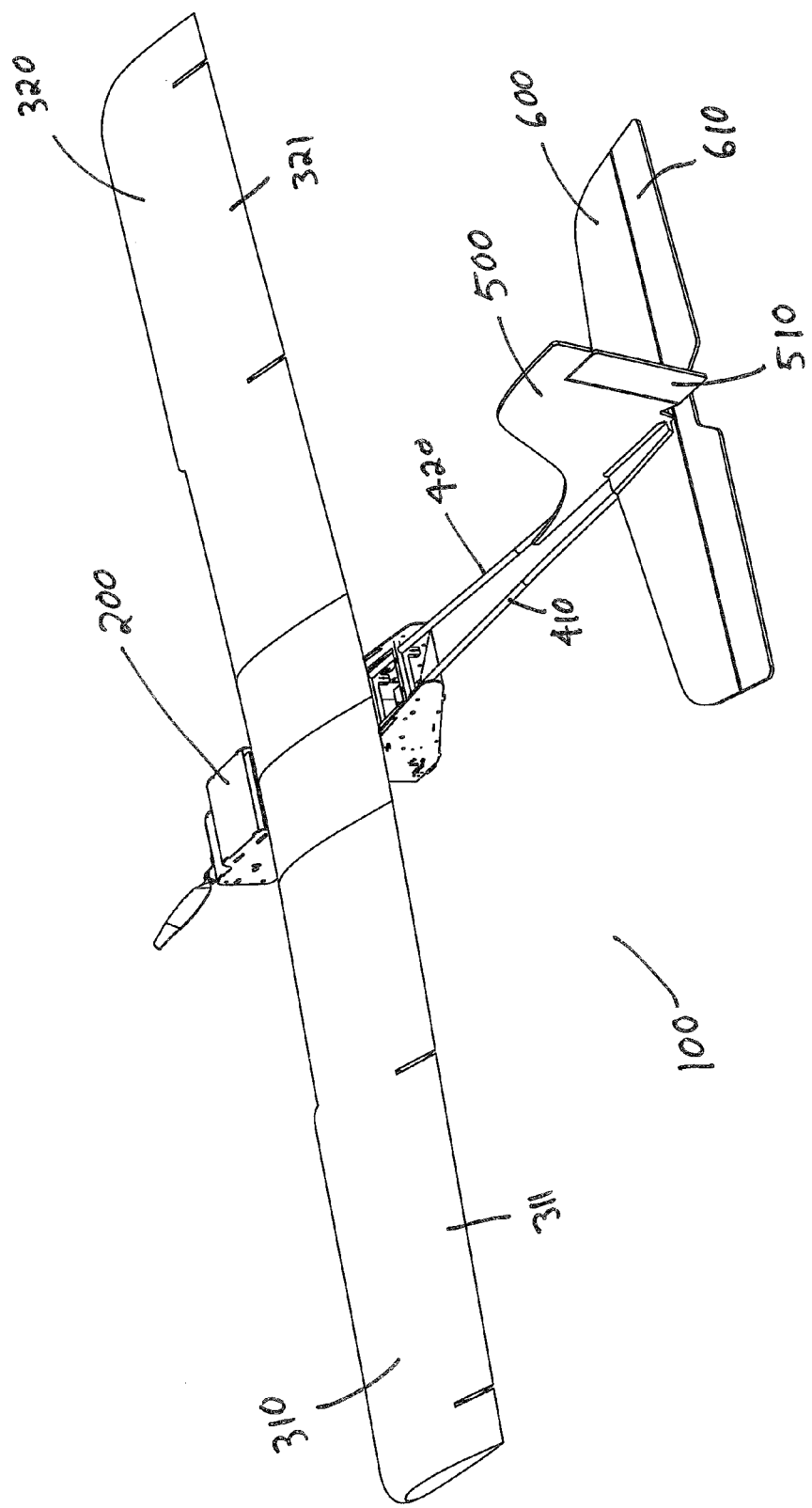
FIG. 9 is a rear perspective view of the UAV of FIG. 1 in accordance with an embodiment of the invention.
Figure 10:
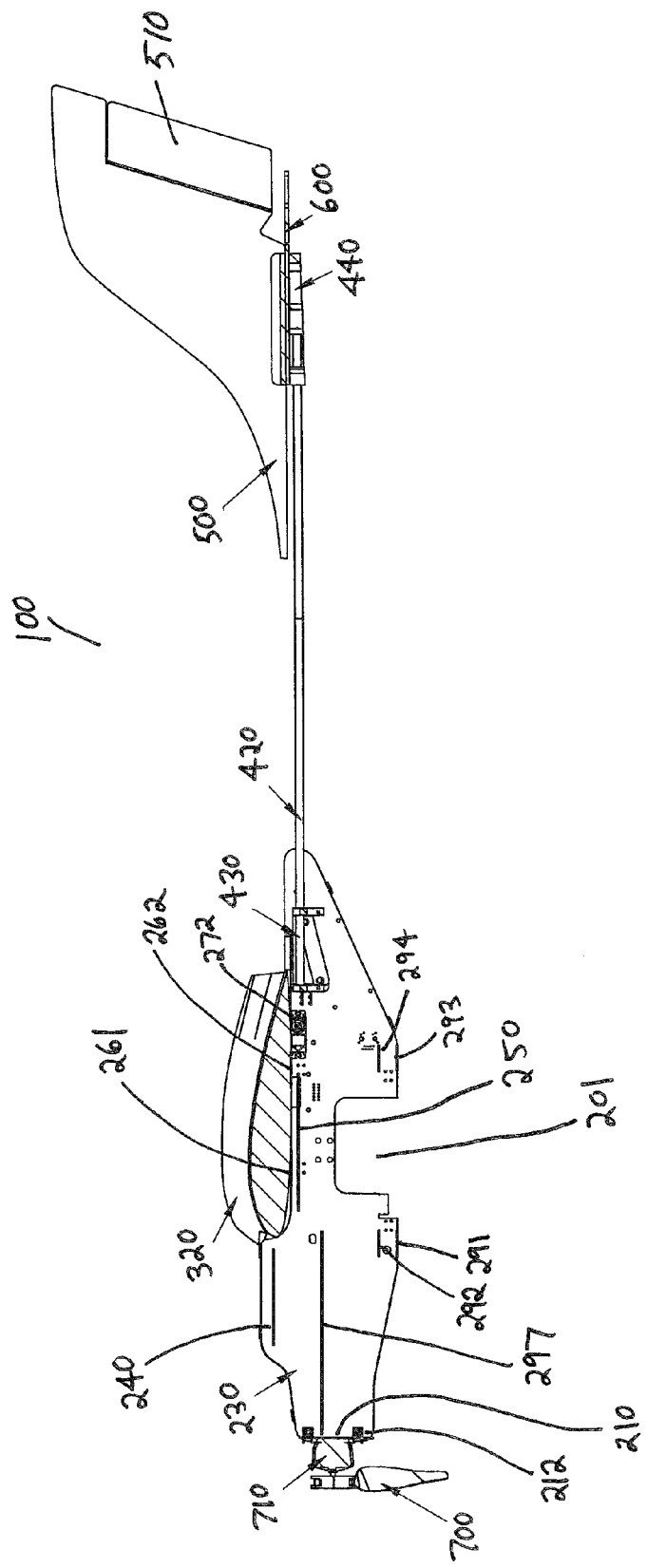
FIG. 10 is a cross sectional view of the UAV of FIG. 1 taken along line A-A in FIG. 6 in accordance with an embodiment of the invention.
Figure 11:
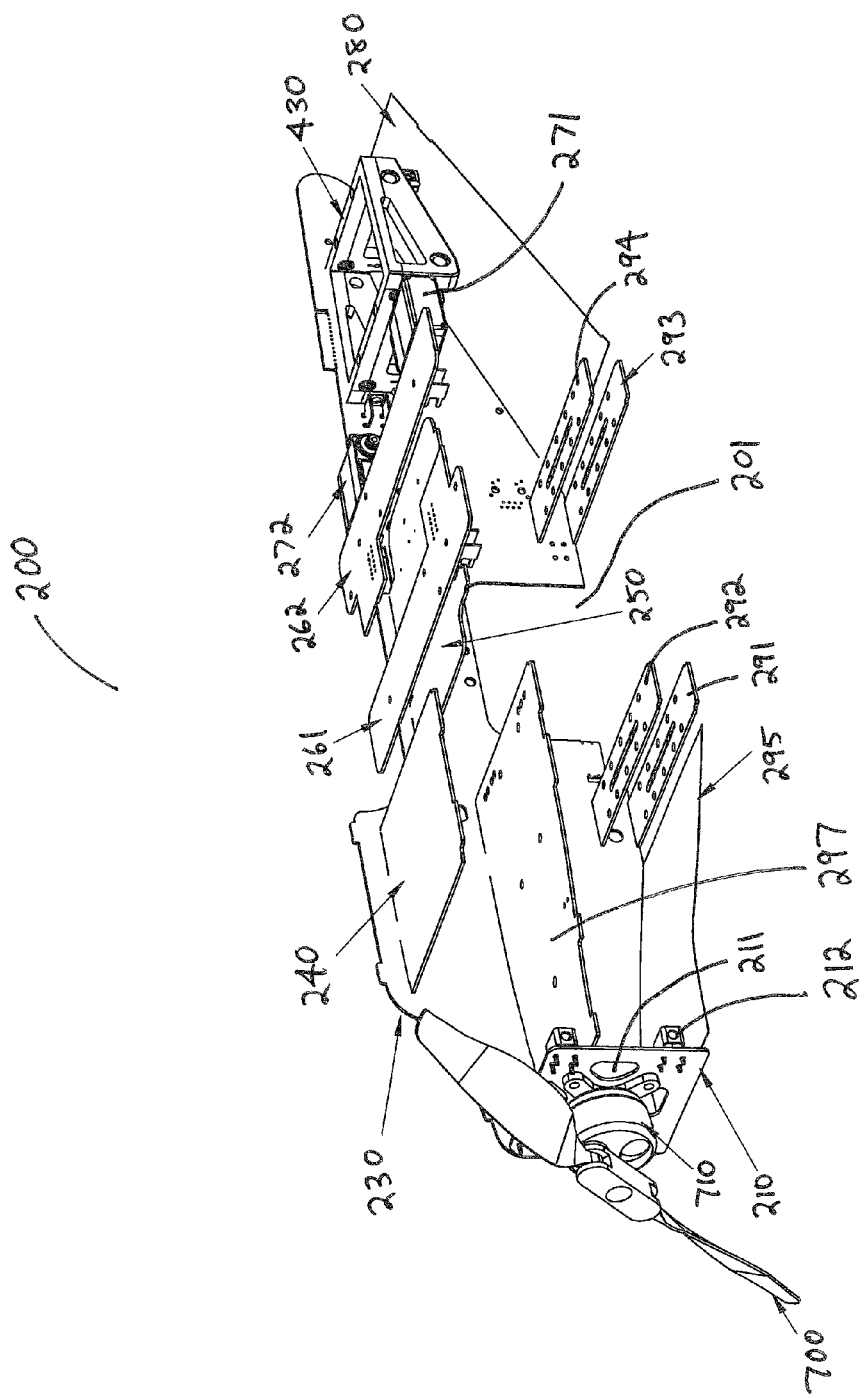
FIG. 11 is an exploded view of the fuselage of the UAV of FIG. 1 in accordance with an embodiment of the invention.
Figure 37:
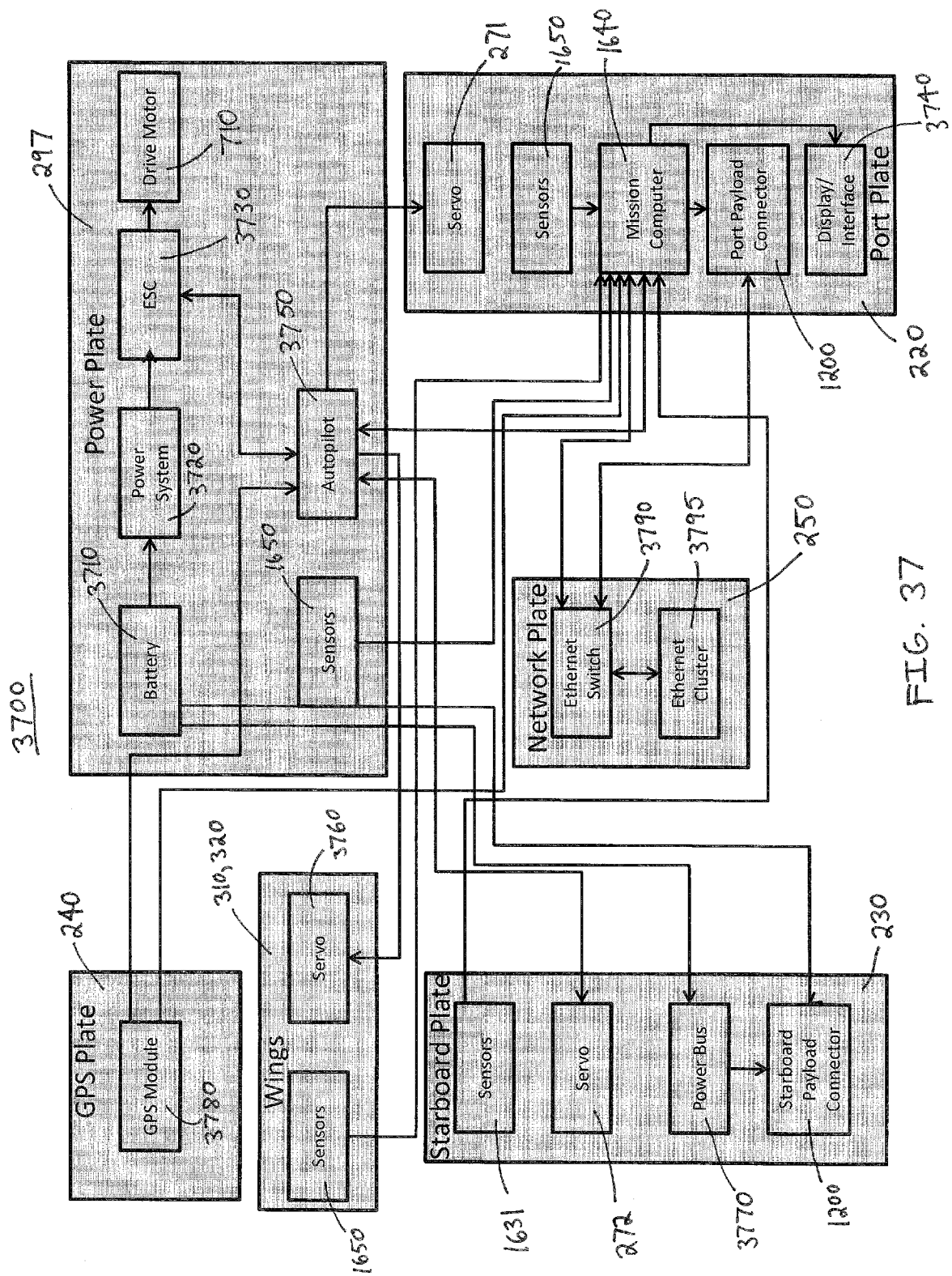

FIG. 1 is front perspective view illustrating an unmanned aerial vehicle ("UAV") 100 in accordance with an embodiment of the invention. FIG. 2 is a front view of the UAV 100 of FIG. 1 in accordance with an embodiment of the invention. FIG. 3 is a rear view of the UAV 100 of FIG. 1 in accordance with an embodiment of the invention. FIG. 4 is a right side view of the UAV 100 of FIG. 1 in accordance with an embodiment of the invention. FIG. 5 is a left side view of the UAV 100 of FIG. 1 in accordance with an embodiment of the invention. FIG. 6 is a top view of the UAV 100 of FIG. 1 in accordance with an embodiment of the invention. FIG. 7 is a bottom view of the UAV 100 of FIG. 1 in accordance with an embodiment of the invention. FIG. 8 is a bottom perspective view of the UAV 100 of FIG. 1 in accordance with an embodiment of the invention. FIG. 9 is a rear perspective view of the UAV 100 of FIG. 1 in accordance with an embodiment of the invention. FIG. 10 is a cross sectional view of the UAV 100 of FIG. 1 taken along line A-A in FIG. 6 in accordance with an embodiment of the invention. FIG. 11 is an exploded view of the fuselage 200 of the UAV 100 of FIG. 1 in accordance with an embodiment of the invention. And, FIG. 37 is a block diagram illustrating a distributed control system 3700 for the UAV 100 of FIG. 1 in accordance with an embodiment of the invention.

Referring to FIGS. 1-9 and 37, according to one embodiment, the UAV 100 includes a fuselage 200 to which are mounted wings 310, 320 and a tail boom 400. A tail 450 including a vertical stabiliser 500 and a horizontal stabiliser 600 is mounted to the aft of the tail boom 400. The UAV 100 is propelled by a drive propeller 700 mounted at the nose of the fuselage 200. The UAV 100 includes a distributed control system 3700 for controlling and monitoring the UAV 100.

The fuselage 200 includes an elongate port side board 220 which forms the right sidewall of the fuselage 200 and an elongate starboard side board 230 which forms the left sidewall of the fuselage 200. The fuselage 200 supports the mechanical structure or airframe of the UAV 100 and contains and protects payload modules and sensors removably mounted in a cargo or payload bay 201. The fuselage 200 houses wiring, electronics, diagnostic components, batteries, sensors, and actuators required for operation of the UAV 100.

The drive propeller 700 may be a folding propeller to reduce blade breakage on landing. The drive motor 710 is coupled to the propeller 700 by a shaft. The motor 710 may be an electric motor which is powered by one or more batteries 3710 mounted in the fuselage 200.

The wings 310, 320 may be formed from foam (e.g., Styrofoam™, etc.) or other lightweight material. The wings 310, 320 may be formed as a single wing or as two separate wings. The wings 310, 320 includes respective ailerons 311, 321 for controlling the roll of the UAV 100. According to one embodiment, the wings 310, 320 may also include respective flaps (not shown) for increasing lift and drag. According to one embodiment, the wings 310, 320 may also include respective slats (not shown) for increasing lift. The wings 310, 320 are the lifting airfoil of the UAV 100. The wings 310, 320 are positioned on the fuselage 200 such that the centre of gravity of the UAV 100 is near the centre of lift of the wings 310, 320 to enhance stability.

The vertical stabiliser 500 may be formed from foam (e.g., Styrofoam™, etc.) or other lightweight material. The vertical stabiliser 500 is the UAV's vertical fin, functions as a yaw stabiliser, and supports the rudder 510.

The horizontal stabiliser 600 may be formed from foam (e.g., Styrofoam™, etc.) or other lightweight material. The horizontal stabiliser 600 is the UAV's horizontal fin, functions as a pitch stabiliser, and supports the elevator 610. According to one embodiment, the horizontal stabiliser 600 may include port and starboard elevators.

The tail boom 400 may consist of separate port and starboard booms 410, 420 mounted to the fuselage 200 by a tail mount 430. The vertical stabiliser 500 and the horizontal stabiliser 600 may be mounted to the aft ends of the booms 410, 420 by a tail cap 440. The tail booms 410, 420 may be formed from carbon fibre (or other lightweight material) and extend from the aft of the fuselage 200 to secure and support the vertical and horizontal stabilisers 500, 600 and related actuator control lines.

The tail mount 430 may be formed from plastic, prototyped, molded, or constructed. It supports the UAV's tail 450 via carbon fibre (or other lightweight material) tail booms 410, 420. The tail mount 430 also functions as a structural member spanning and joining the side boards 220, 230 of the fuselage 200.

The tail cap 440 may be formed from plastic, prototyped, molded, or constructed. It joins the tail booms 410, 420 and affixes the vertical and horizontal stabilisers 500, 600 to the UAV 100.

The control system 3700 includes components (e.g., 1640) and sensors (e.g., 1650) which are distributed over the UAV's PCBs and airframe as described below. The control system 3700 includes a mission computer or processor 1640, various sensors 1650, a display 3740, and an autopilot module 3750.

Referring to FIGS. 10-11, the fuselage 200 of the UAV 100 is constructed from PCBs (e.g., 220, 230) and need not be covered by an external skin or shield. Rather, the PCBs (e.g., 220, 230) provide both mechanical structure for the fuselage 200 of the UAV 200 and electrical connectivity between electrical components mounted thereon. As will be described in more detail below, the fuselage 200 includes a firewall plate or board 210, a propeller 700, a motor 710, side boards 220, 230, a power board 297, a GPS board 240, a network board 250, wing connect boards 261, 262, servo motors 271, 272, a tail mount 430, a tail cover 280, float struts 291, 292, 293, 294, a chin cover 295, a top cover 299, and a payload bay 201.

The fuselage 200 includes a firewall board 210 formed from PCB material. The firewall board 210 is typically formed from thicker, stronger, and heavier PCB material than that used for other fuselage components owing to the added strength needed to support the drive propeller 700 and motor 710, which are mounted thereto, and to strengthen and secure the nose of the UAV 100. The firewall board 210 functions as a structural member of the fuselage 200, provides stiffness and strength to the fuselage 200, and connects the side boards 220, 230 of the fuselage 200 together. As mentioned, the firewall board 210 also secures the motor 710 to the fuselage 200. The firewall board 210 has formed therein one or more vents 211 to permit cooling airflow through the fuselage 200.

The firewall board 210 may be attached to the port and starboard side boards 220, 230 via four screw and threaded fasteners 212 which provide both mechanical and electrical connections. In particular, two threaded fasteners 212 mounted at the top and bottom of each side of the firewall board 210 are connected to the nose ends of each of the port and starboard side boards 220, 230 via standard threaded screws which pass through clearance holes in the side boards 220, 230 of the fuselage 200. The four threaded screw and corresponding threaded fasteners 212 mounted on the firewall board 210 provide an electrical connection path for an electric voltage supply and communications circuitry to a thermal sensor (e.g., 1650) soldered on a PCB mounted immediately behind the motor 710 to sense the temperature of the motor 710. A mission computer or processor 1640 may read this data relating to the status of the motor 710 for diagnostic and control purposes. The four threaded screws and corresponding threaded fasteners 212 provide the necessary strength to withstand impact of the nose of the UAV 100 with the ground upon landing.

The electric drive motor 700 is used to drive or turn the propeller 700. The motor 700 is driven by an electronic speed control ("ESC") module 3730 and power system 3720 which are coupled to one or more batteries 3710. The propeller 700 is used to provide thrust for the UAV 100. The propeller 700 may have a folding configuration to avoid blade breakage on landing when the UAV 100 is landed on its belly. The batteries 3710 may be lithium polymer batteries, typically having at least a 3900 mAHr capacity.

The port side board 220 is formed from PCB material. The port side board 220 may have mounted thereon components (e.g., 1650) and processors (e.g., 1640) for flight control, diagnostics, user interface, communications, and display electronics (e.g., 3740). It may also provide electrical and communications signals (e.g., via 1200) to a payload module (e.g., USB, USB on-the-go, Ethernet, PWM, IIC, digital lines, etc.) which may be mounted in the payload bay 201.

The starboard side board 230 is formed from PCB material. The starboard side board 230 forms a sidewall of the fuselage 200. Like the port side board 220, the starboard side board 230 is both a structural component and an electronic component of the fuselage 200. The starboard side board 230 may contain a variety of circuits and electronic components. For example, the starboard side board 230 may support electrical connectivity to a starboard wing aileron servo motor 3760 (embedded in the starboard wing 320) and to a rudder servo motor 272 (mounted near the aft end of the fuselage 200). The starboard side board 230 may also contain diagnostic circuits (e.g., trace 1631) to sense damage and wear to the starboard side of the UAV 100, temperature, and atmospheric pressure. The starboard side board 230 may also contain power supply components (e.g., power bus 3770) which provide necessary voltage supplies to the various components of the UAV 200 and to the payload module optionally mounted in the payload bay 201.

In critical areas, the port and starboard side boards 220, 230 may include an internal copper plane to enhance shielding and reduce radio frequency ("RF") noise affecting or emanating from electrical and electronic components in the UAV 100.

The power board 297 is formed from PCB material. The power board 297 is mounted horizontally behind the firewall board 210 between the port and starboard side boards 220, 230. The power board 297 functions as both a structural component and an electrical component of the fuselage 200. Structurally, the power board 297 may be tapered toward the nose of the UAV 100 thus tapering the side boards 220, 230. The power board 297 functions as an electronics bus between the port and starboard side boards 220, 230. It may also house an electronic speed control module 3730 which generates power lines for the servo motors (e.g., 271, 272). The power board 297 is the main connection point for flight batteries 3710 which are mounted thereto and for corresponding power circuitry (i.e., power transmission traces to the electronic speed control module 3730 and lighter traces to the voltage supplies which then power the voltage or power bus 3770). The power board 297 may use battery switching technology to be able to draw power from alternate or optional batteries 3710 independently. According to one embodiment, an optional battery may be mounted in the fuselage 200 above the tail cover 280 aft of the payload bay 201. The power board 297 may include connection points for a radio modem and a radio which may be mounted thereto.

The geographical positioning system ("GPS") board 240 is formed from PCB material. The GPS board 240 is mounted horizontally above the power board 297 between the port and starboard side boards 220, 230. The GPS board 240 functions as both a structural component and an electrical component of the fuselage 200. Structurally, the GPS board 240 provides structural support to the fuselage 200 by increasing stiffness and strength. It also serves to shield a static air pressure sensor mounted internal to the fuselage 200 from direct sunlight which helps to avoid erroneous altimeter readings. During assembly, the GPS board 240 may be used to align the various components of the fuselage 200 and UAV 100. As an electronic component, the GPS board 240 contains or has mounted thereon a GPS receiver module 3780, a GPS antenna, pulse-per-second indicators, communications circuitry, and supporting components. The GPS board 240 may also contain a copper plane for improving performance of the GPS antenna.

The network board 250 is formed from PCB material. The network board 250 is mounted horizontally aft of the GPS board 240 and above the payload bay 201 between the port and starboard side boards 220, 230. The network board 250 functions as both a structural component and an electrical component of the fuselage 200. Structurally, the network board 240 provides structural support to the UAV 100 to increase stiffness and strength. As an electrical component, the network board 250 contains circuitry to support two separate computer-on-module units and Ethernet networking components. The Ethernet networking components may facilitate communications between the two computer modules. The Ethernet networking components (e.g., Ethernet cluster 3795) may also include a 10 Mbps Ethernet switch 3790 to communicate between the computer modules and a main mission control computer or processor 1640 located on the port side board 220, two separate Ethernet lines to the payload bay 201, and an Ethernet line to a RJ-45 jack located on the starboard side board 230.

The two wing connect boards 261, 262 are formed from PCB material. The wing connect boards 261, 262 are mounted horizontally above and at each of the fore and aft ends of the network board 250 between the port and starboard side boards 220, 230. The wing connect boards 261, 262 function as both structural components and electrical components of the fuselage 200. The wing connect boards 261, 262 are used to: provide electrically connectivity between the sensors 1650 and actuators/servos 3760 in the wings 310, 320 and the rest of the UAV 100; provide a means to attach the wings 310, 320 (which may be removed from the UAV 100 for transport) together and to the fuselage 200; and, provide torsional stiffness to the wings 310, 320 at the joint between them. The wing connect boards 261, 262 are symmetric and may be interchanged with each other until installed on the wings 310, 320 at which point the boards 261, 262, connectors, and wings 310, 320 may become polarised such that they may only be installed in one, correct, configuration.

The servo motors 271, 272 are driven by electronics mounted on the side boards 220, 230 and are used to actuate the flight control surfaces (e.g., 510, 610) of the UAV 100. The starboard servo motor 272 is mounted on the inner side of the starboard side board 230 aft of the network board 250 and drives the rudder 510 via a pushrod system installed along the tail booms 410, 420. The port servo motor 271 is mounted on the inner side of the port side board 220 aft of the network board 250 and drives the elevator 610 via a pushrod system installed along the tail booms 410, 420. In addition, servo motors (e.g., 3760) embedded in the wings 310, 320 drive the ailerons 311, 321 directly via metal linkages.

The tail mount 420 is mounted horizontally aft of the servo motors 271, 272 between the side boards 220, 230 of the fuselage 200. As mentioned above, the tail mount 430 may be formed from plastic, prototyped, molded, or constructed. The tail mount 430 supports the UAV's tail 450 via carbon fibre (or other lightweight material) tail booms 410, 420. The tail mount 430 also functions as a structural member spanning and joining the side boards 220, 230 of the fuselage 200. The tail mount 430 may be used to tapper the aft ends of the side boards 220, 230 to improve aerodynamic performance of the UAV 100.

The tail cover 280 is formed from PCB material. The tail cover 280 is mounted horizontally under the tail mount 430 between the port and starboard side boards 220, 230. The tail cover 280 is a thin, flexible board used to provide protection for the internal components of the UAV 100 from dust and dirt and to provide improved aerodynamic performance by providing a smoother transition to the tail booms 410, 420 following the tapering of the side boards 220, 230 at their aft ends. In general, the tail cover 280 has no electrical function. However, it some embodiments, an optional battery may be mounted thereon.

The four float struts 291, 292, 293, 294 are formed from PCB material. The float struts 291, 292, 293, 294 are mounted horizontally in vertical pairs (e.g., 292/291 and 294/293) on each of the fore and aft sides of the payload bay 201 between the bottom edges of the port and starboard side boards 220, 230. The float struts 291, 292, 293, 294 function as structural components to increase strength and rigidity of the fuselage 200. In addition, they are used as hard mount points when the UAV 100 is operated with amphibious floats, wheels, or other external accessories. In general, the UAV 100 is not equipped with landing gear when used over land.

The chin cover 295 is formed from PCB material. The chin cover 295 is mounted horizontally under the power board 297 aft of the firewall board 210 between the lower edges of the port and starboard side boards 220, 230. The chin cover 295 is a thin, flexible board used to provide protection for the internal components of the UAV 100 from dust and dirt and to provide better aerodynamic performance by providing a smoother transition from the firewall board 210 to the first set of float struts 291, 292 fore of the payload bay 201 following the tapering of the side boards 220, 230 at their fore ends. The chin cover 295 also provides structural stiffness to the a battery holder to which it may be attached. In general, it has no electrical function.

The top cover 299 is formed from PCB material. The top 299 is mounted horizontally over the power board 297 and the GPS board 240 aft of the firewall board 210 between the upper edges of the port and starboard side boards 220, 230. The top cover 299 is a thin, flexible board used to provide protection for the internal components of the UAV 100 from dust and dirt and to provide better aerodynamic performance by providing a smoother transition from the firewall board 210 to the wings 310, 320 following the tapering of the side boards 220, 230 at their fore ends. In general, it has no electrical function.

Figure 12:
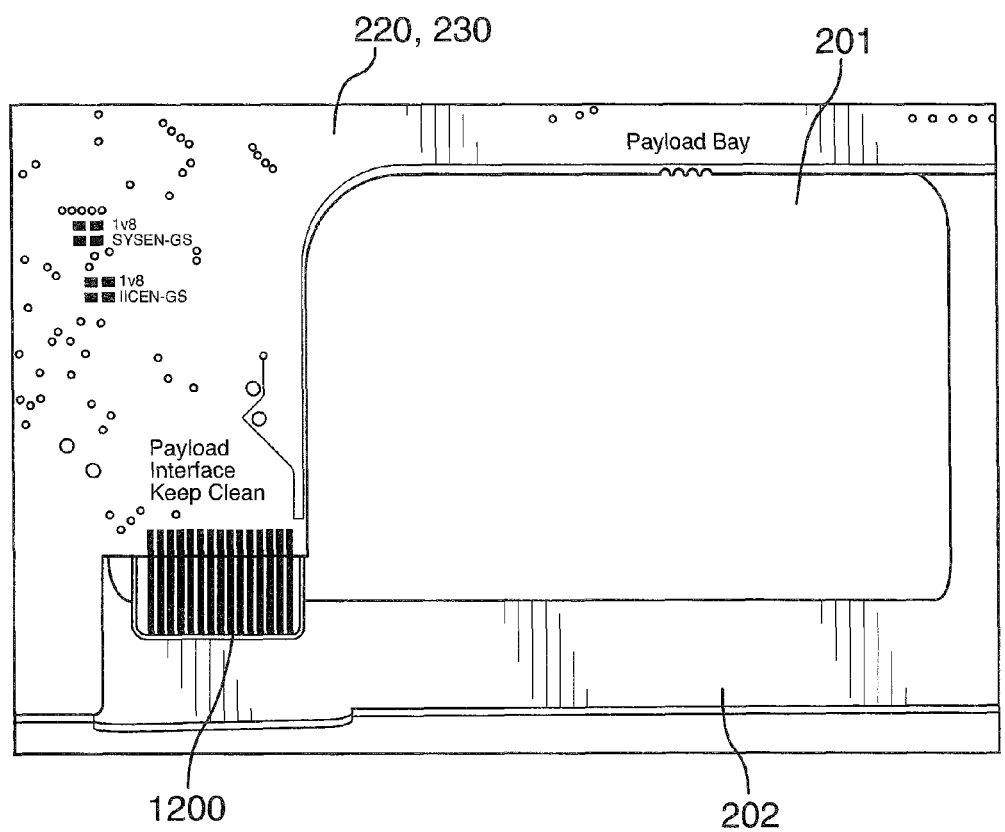
FIG. 12 is an enlarged side view of the fuselage of the UAV of FIG. 1 illustrating the payload bay in accordance with an embodiment of the invention.

FIG. 12 is an enlarged side view of the fuselage 200 of the UAV 100 of FIG. 1 illustrating the payload bay 201 in accordance with an embodiment of the invention. The payload bay 201 is positioned on the bottom of the fuselage 200 and is for receiving variously configured payload modules. For example, a camera module may be loaded into the payload bay 201 for scanning a farmer's field. The payload module may be coupled to various electronic components onboard the UAV 100 using an edge connector which may be received by a payload interface 1200 etched into a side board 220, 230 of the fuselage 200 as shown in FIG. 12. FIG. 12 is one example of how PCBs may be used to directly provide removable electrical connections by using shape and conductor placement to mate with other components. The payload bay 201 may be covered by an optional payload bay cover 202.

Thus, the fuselage 200 of the UAV 100 is constructed using PCBs with integral electronic circuits in addition to foam, plastic, and carbon fibre used for the wings 310, 320 and tail 450, tail mount 430, tail cap 440, and tail boom 400.

Specifically, the fuselage 200 of the UAV 100 is constructed using PCBs arranged in a three-dimensional, box-like configuration and connected to one another using one or more different types of connections. As described above, some of the PCBs may or may not contain active or passive electric circuits and some may or may not serve to provide mechanical structure.

By using PCBs as the structural material, the UAV's fuselage 200 functions as the UAV's circuitry, computer, and diagnostic platform. It enables the use of embedded "sensor-as-structure" construction which allows sensors to be placed in areas of key mechanical need. For example, pressure sensors which are sensitive to direct sunlight may be placed under the wings 310, 320 inside the fuselage 200 to protect them from sunlight. Accelerometers used to measure aircraft pose and which are critical for stabilisation may be ideally placed at the centre of gravity of the UAV 100. In addition, temperature sensors may be placed at locations of need such as at the motor 710, speed controllers, and throughout the UAV 100. All of this may be accomplished without the need for complicated, bulky, heavy, and hard to manufacture wiring harnesses.

Where PCBs are connected to one another, the connection may be referred to as a board-to-board connection. Board-to-board connections may serve to provide electrical connectivity, mechanical connectivity, or both. According to one embodiment, board-to-board connections may take the form of one or more of the following types: screw and threaded fastener; angled solder pad; and, slot and tab.

Figure 13:
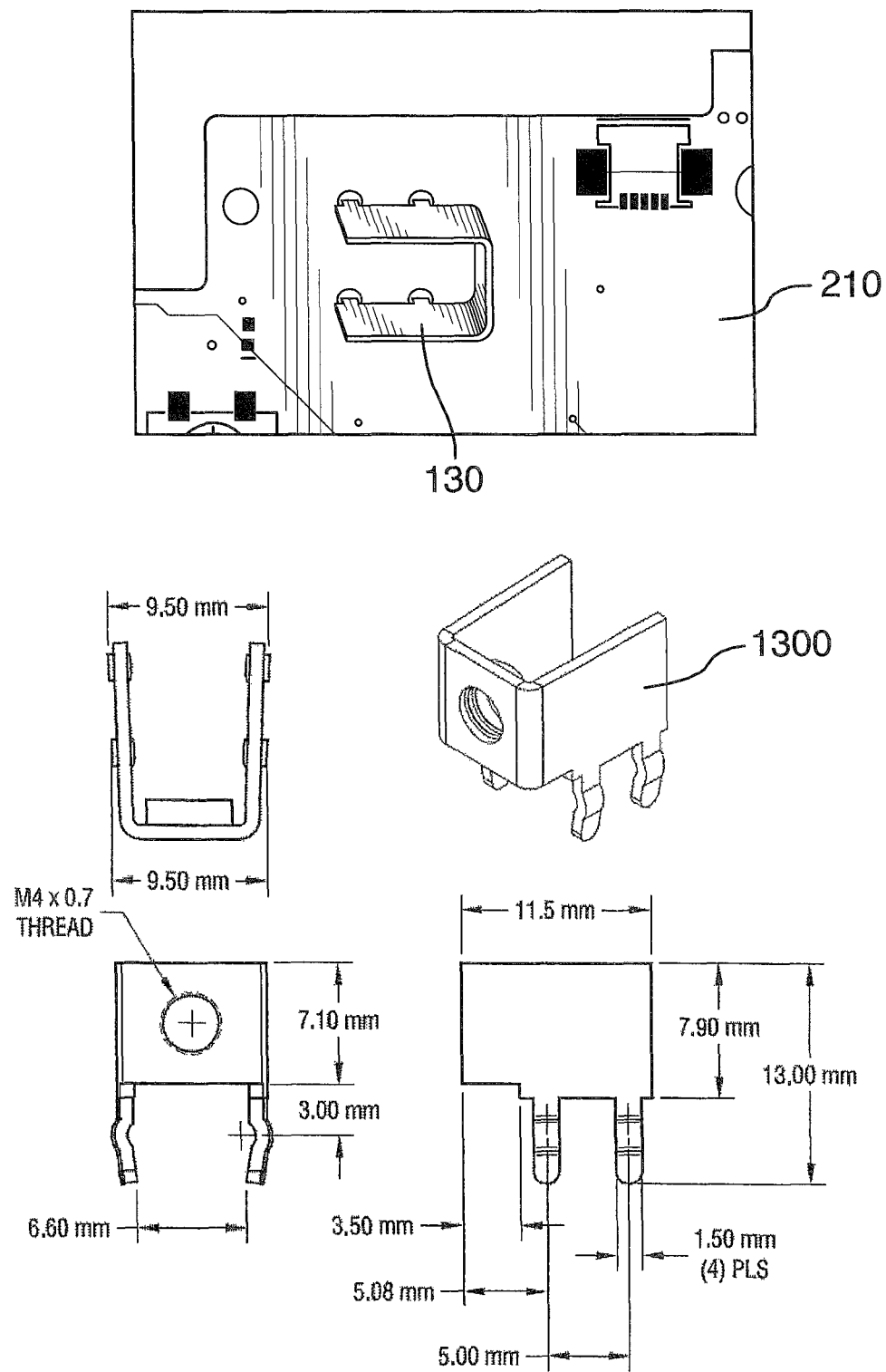
FIG. 13 is a perspective view illustrating a threaded fastener for joining printed circuit boards in accordance with an embodiment of the invention.

FIG. 13 is a perspective view illustrating a threaded fastener 212 for joining PCBs in accordance with an embodiment of the invention. Connections may be achieved using components that are soldered to one PCB and attached to another PCB via a threaded fastener 212. In particular, PCBs may be connected to other components (such as wings 310, 320, tail 450, etc.) using standard threaded fasteners 212. As described above, this is how the firewall board 210 may be connected to the side boards 220, 230. The threaded fastener 212 is soldered to a first PCB (e.g., firewall board 210) and a screw is passed through an opening formed in a second PCB (e.g., side board 220) and is received by the threaded fastener 212.

Figure 14:
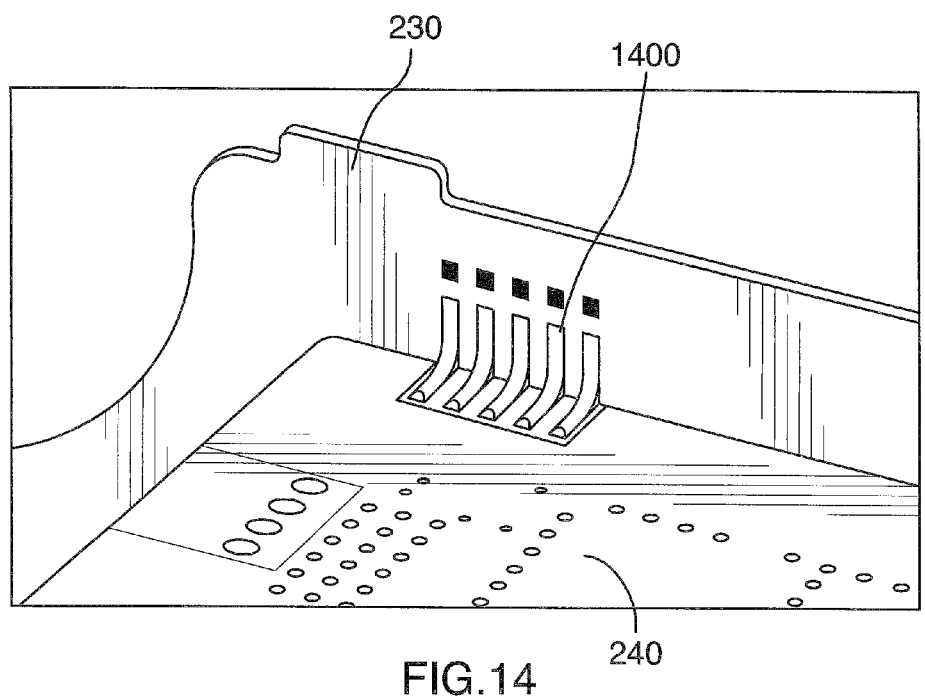
FIG. 14 is a perspective view illustrating an angled solder pad board-to-board connection in accordance with an embodiment of the invention.

FIG. 14 is a perspective view illustrating an angled solder pad board-to-board connection 1400 in accordance with an embodiment of the invention. Board-to-board connections may be implemented using angled solder points or pads 1400 which are then joined using a bead of solder. This method of connection may be combined with the slot and tab method described below.

Figure 15:
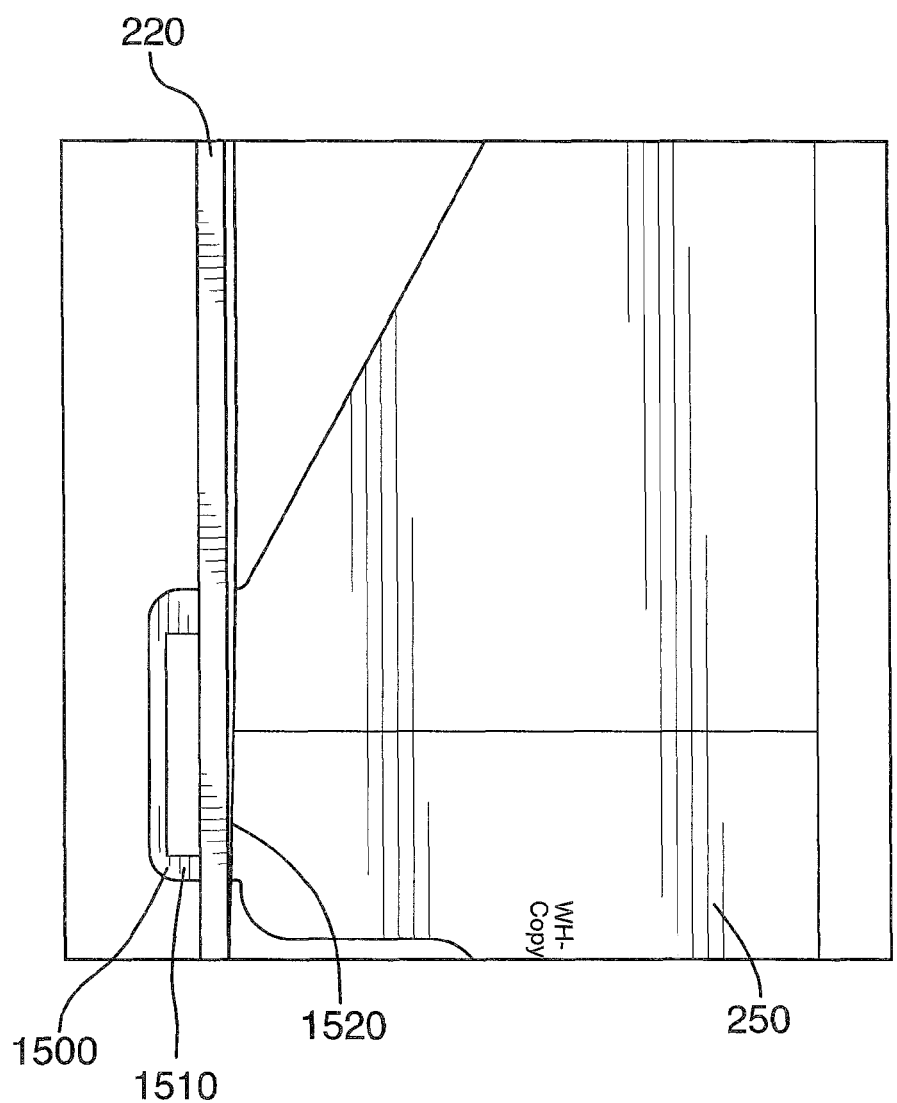
FIG. 15 is a top view illustrating a slot and tab board-to-board connection in accordance with an embodiment of the invention.

FIG. 15 is a top view illustrating a slot and tab board-to-board connection 1500 in accordance with an embodiment of the invention. Board-to-board connections may be implemented by inserting fitted tabs 1510 on a first PCB (e.g., network board 250) into corresponding slots 1520 on a second PCB (e.g., side board 220) to which a bead of solder is then applied as a mechanical adhesive and/or to complete an electrical connection.

Figure 16:
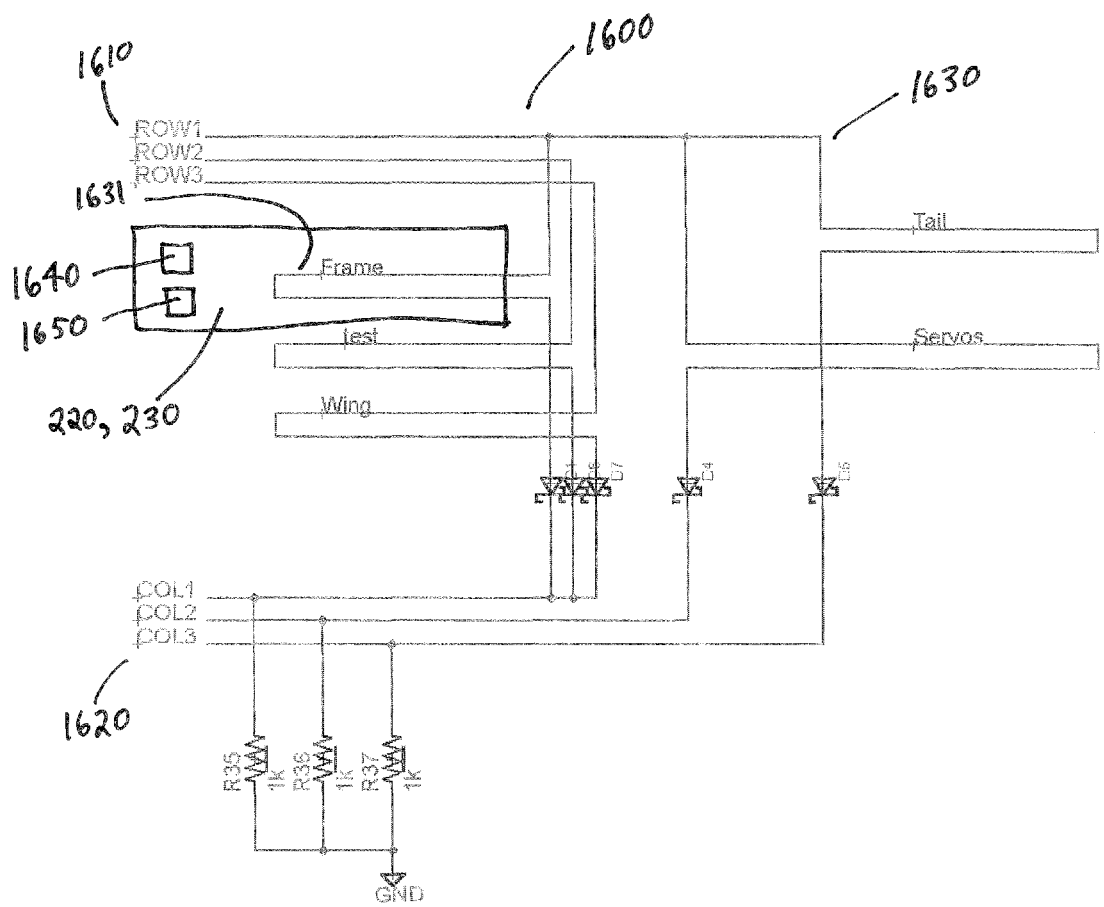
FIG. 16 is a block diagram illustrating a diagnostic circuit for monitoring airframe integrity in accordance with an embodiment of the invention.

FIG. 16 is a block diagram illustrating a diagnostic circuit 1600 for monitoring airframe (i.e., fuselage 200, wings 310, 320, boom 400, tail 450) integrity in accordance with an embodiment of the invention. The circuits (e.g., 1600) formed on the various PCBs (e.g., 230) of the UAV 100 may serve a variety of functions including diagnostics, computation, and communications (which may include board-to-board, board-to-component, or device-to-device communications). Diagnostic circuits 1600 may include sensors which may be implemented in passive sensor-as-structure form using only copper traces (e.g., 1631). Sensors may also be discrete devices (e.g., 1650) used to measure performance or status of key aircraft and flight control components and parameters. Sensors 1650 may also be implemented by other means using the circuit carrying capacity of the UAV's PCBs. In FIG. 16, the diagnostic circuit 1600 includes a matrix of rows 1610 and columns 1620 of connected conductive traces 1630 that are monitored by a processor 1640 to detect cracks and other problems relating to the UAV's airframe. For example, a trace 1631 may be etched into and routed around the perimeter of the side boards 220, 230 of the fuselage 200. If a crack forms in one of the side boards 220, 230, the trace 1631 would be broken or damaged and this break or damage may be detected by the processor 1640 and reported to the user (e.g., via display 3740). As another example, a trace may be used to monitor the connection of a flight control servo motor 271 to a side board 220 via encircling the mounting hole(s) for the servo motor 271 in the side board 220. As a further example, a trace may be used motor a board-to-board connection by encircling the mounting hole(s) for a thread connector 212 in the firewall board 210.

According to one embodiment, in addition to use as part of the UAV 100, the fuselage 200 of the UAV 100 may also be used as a standalone computational, electrical, and sensing platform. For example, the fuselage 200 may be mounted on a conventional aircraft as a platform for performing various functions.

In operation, according to one embodiment, the memory of the processor 1640 of the UAV 100 may be loaded with a flight plan relating to scanning a farmer's field for crop growth information. A camera module may be loaded into the payload bay 201 to perform the scanning. The motor 710 of the UAV 100 may be started remotely and the UAV 100 may be hand or ground launched. Data received from the camera module may be stored in memory on board the module or on board the UAV 100 or the data may be transmitted to an external system from the UAV 100. After the field is scanned, the UAV 100 may be instructed to land by a user on the ground employing a remote control unit.

Figure 17:
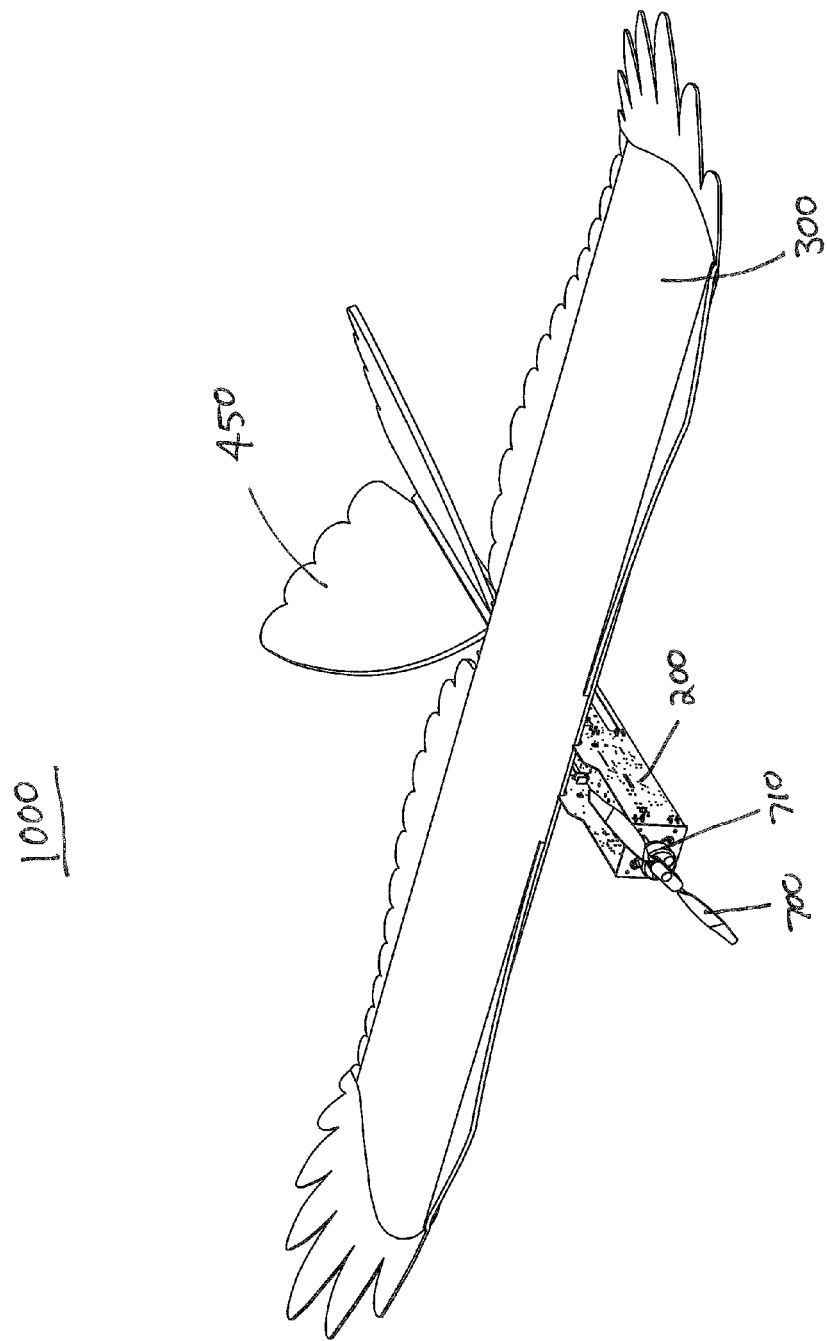
FIG. 17 is front perspective view illustrating an alternate unmanned aerial vehicle ("UAV") in accordance with an embodiment of the invention.
Figure 18:
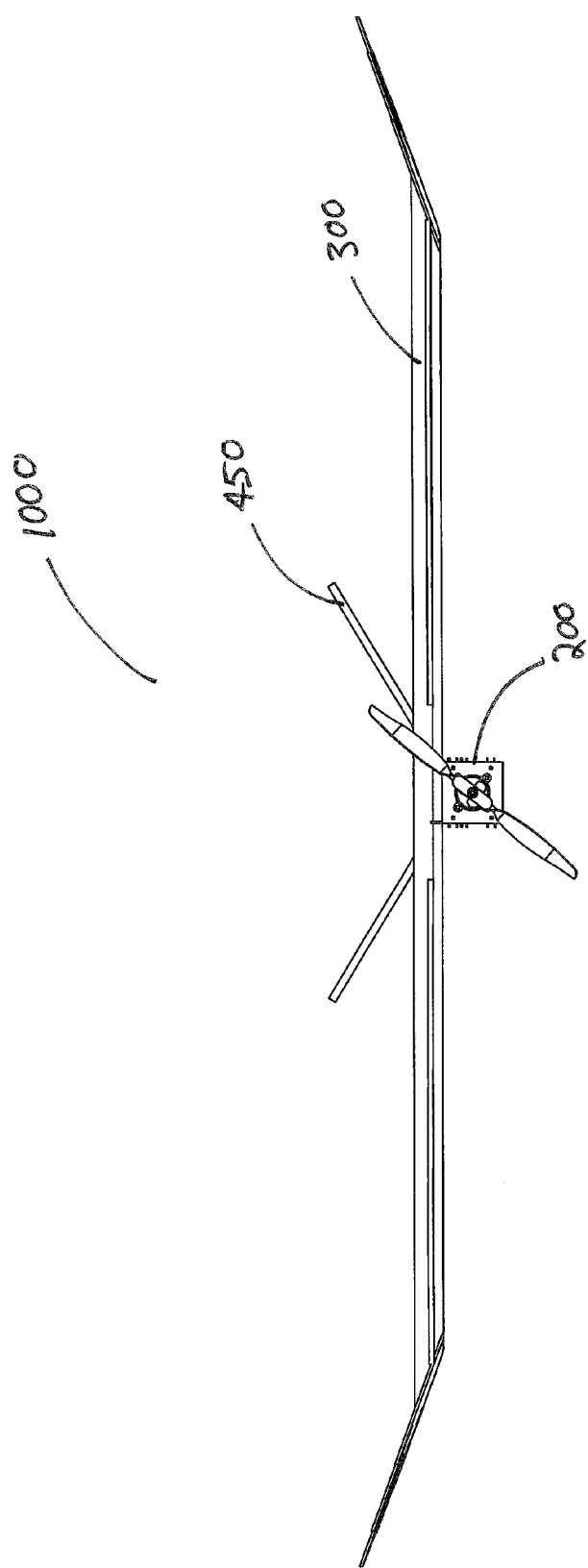
FIG. 18 is a front view of the UAV of FIG. 17 in accordance with an embodiment of the invention.
Figure 19:
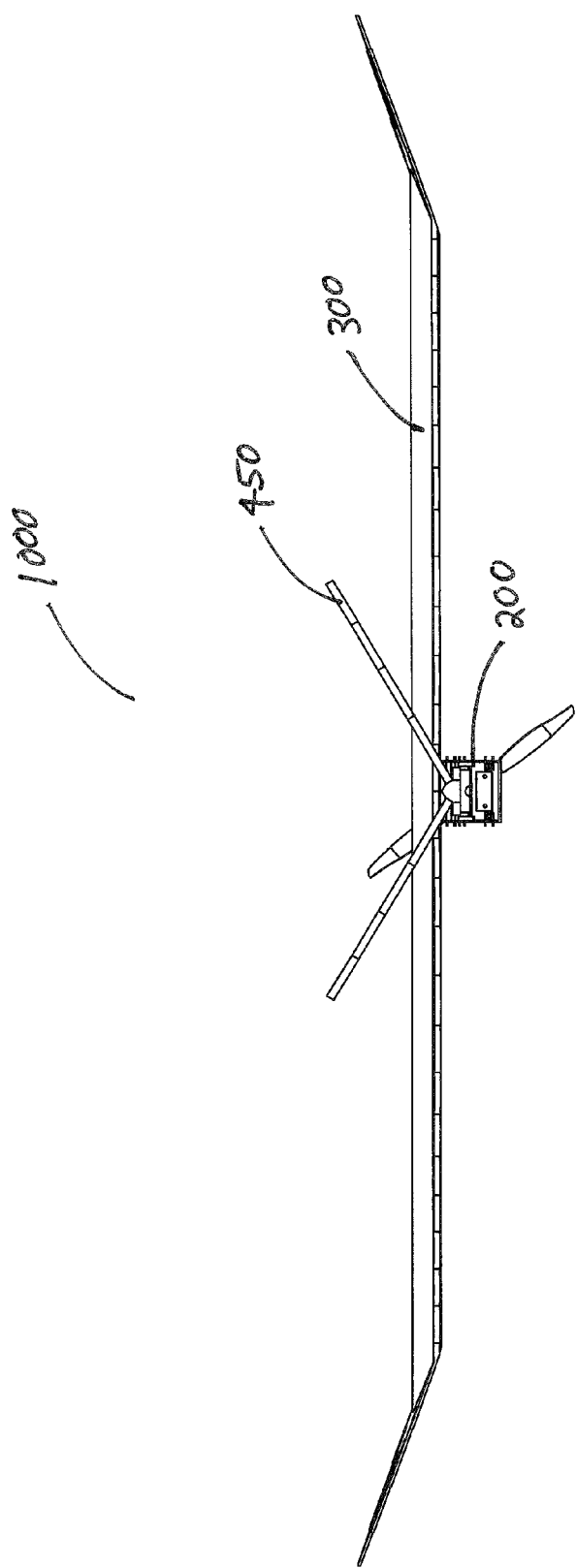
FIG. 19 is a rear view of the UAV of FIG. 17 in accordance with an embodiment of the invention.
Figure 20:
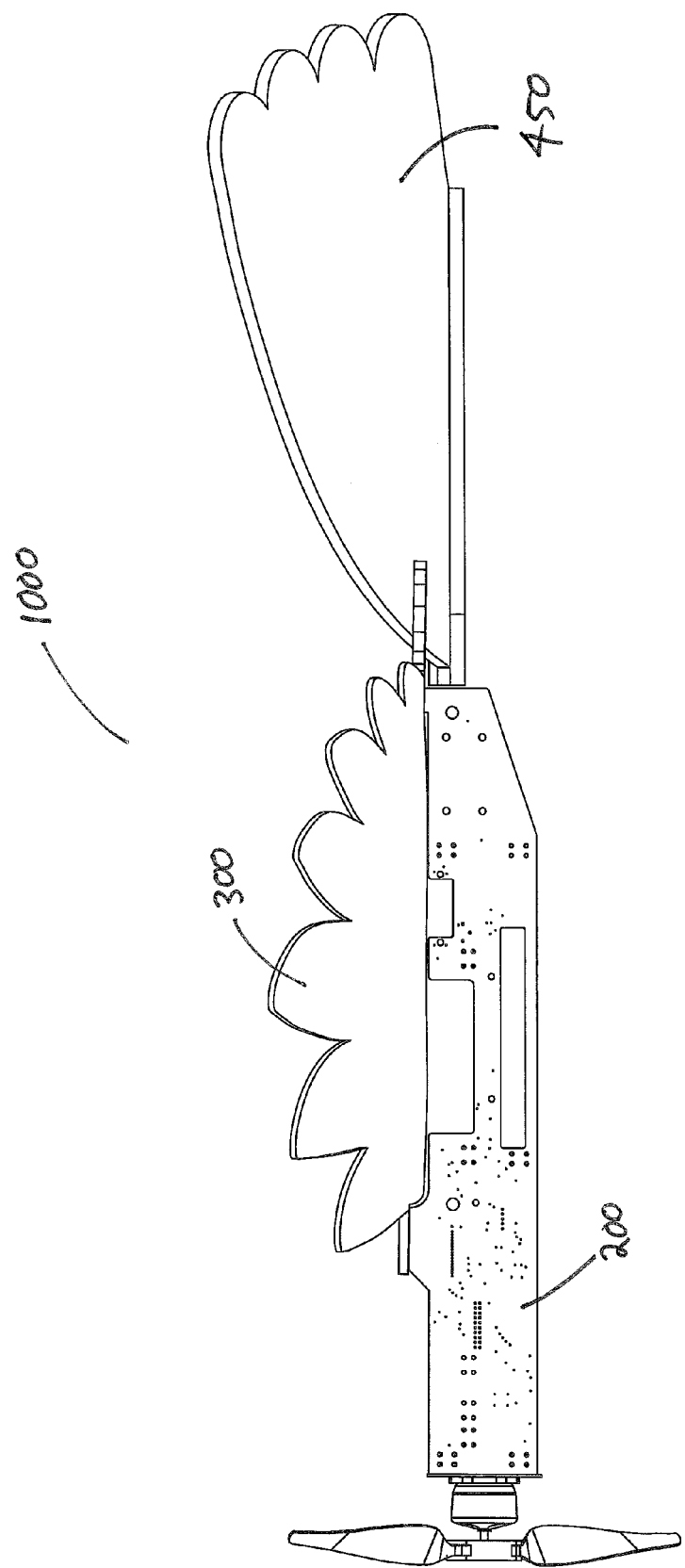
FIG. 20 is a right side view of the UAV of FIG. 17 in accordance with an embodiment of the invention.
Figure 21:
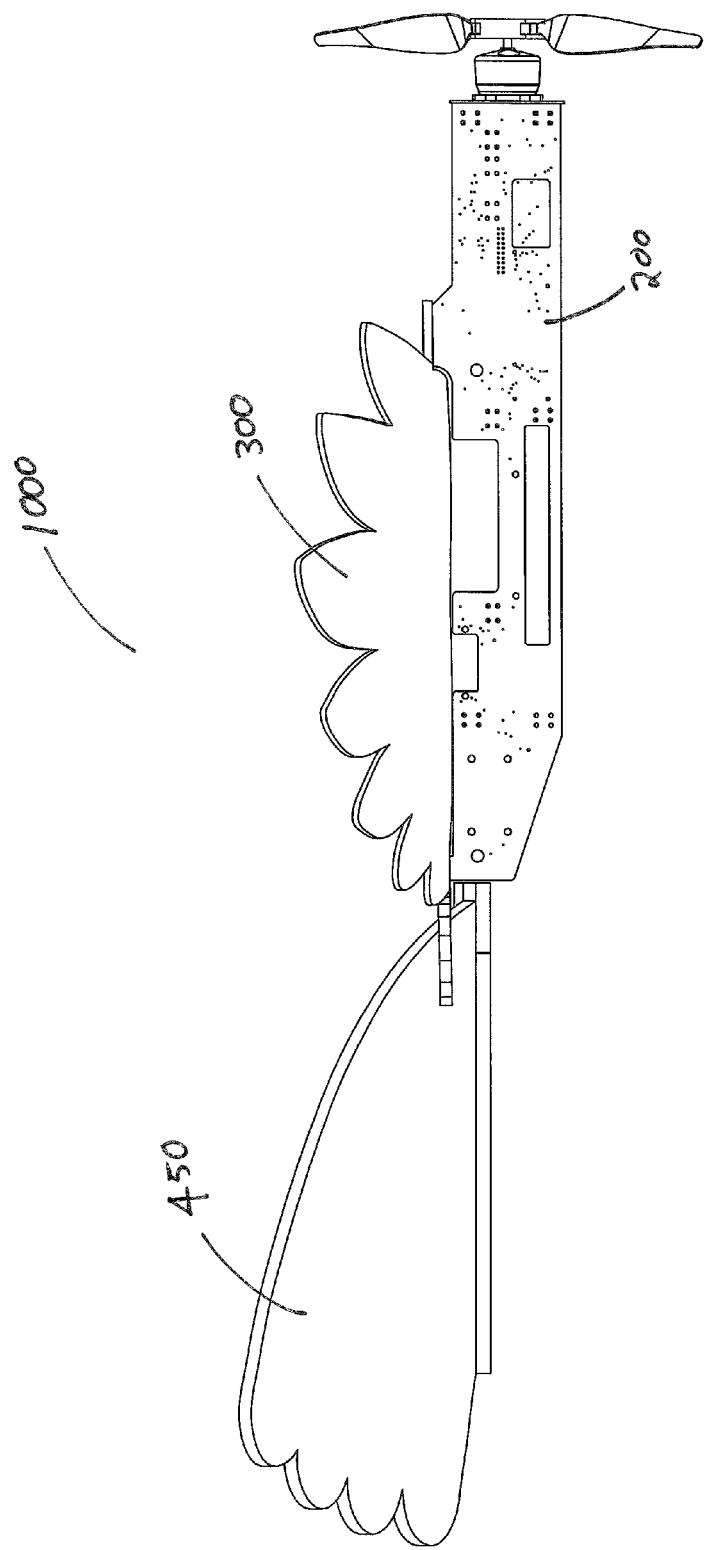
FIG. 21 is a left side view of the UAV of FIG. 17 in accordance with an embodiment of the invention.
Figure 22:
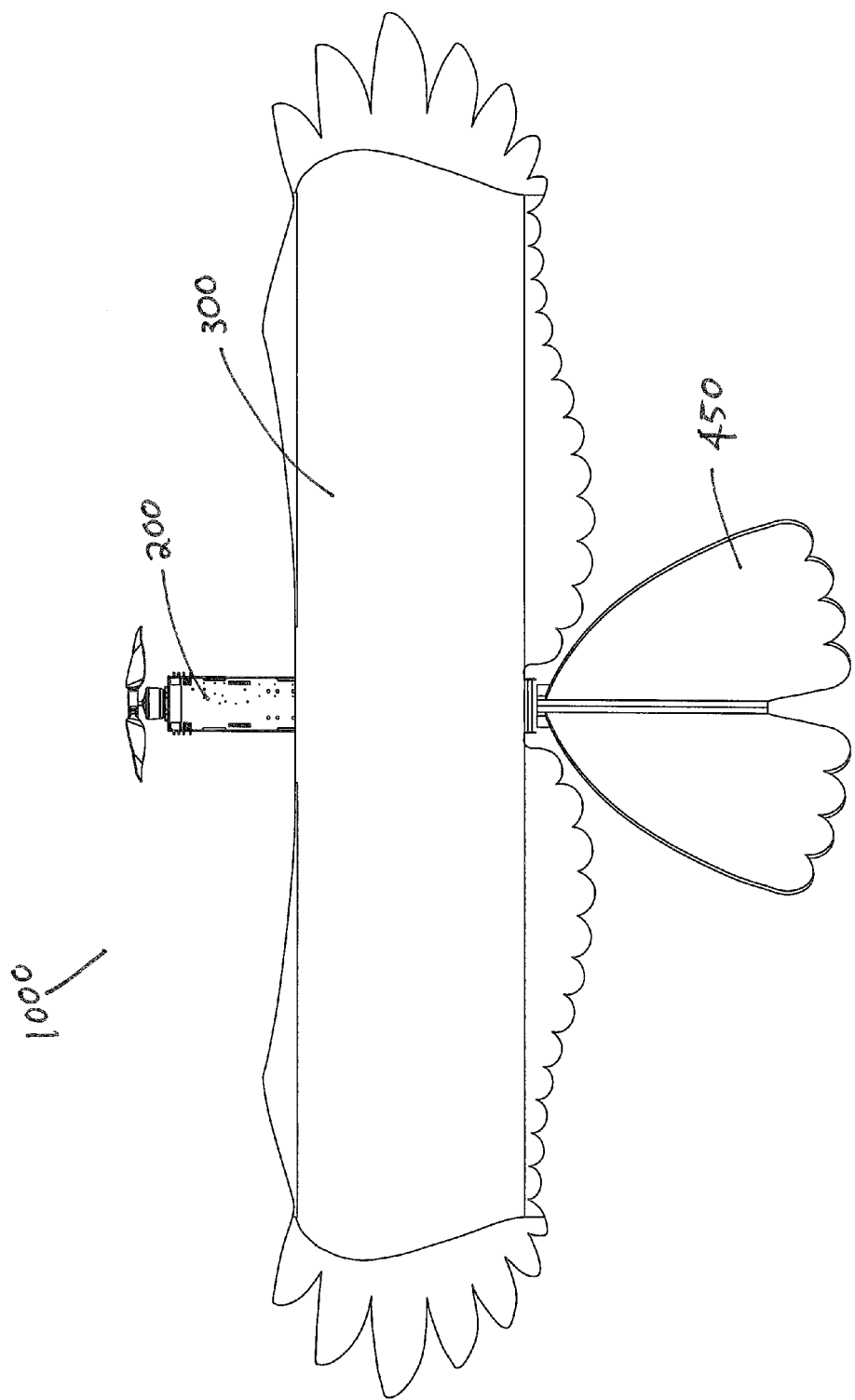
FIG. 22 is a top view of the UAV of FIG. 17 in accordance with an embodiment of the invention.
Figure 23:
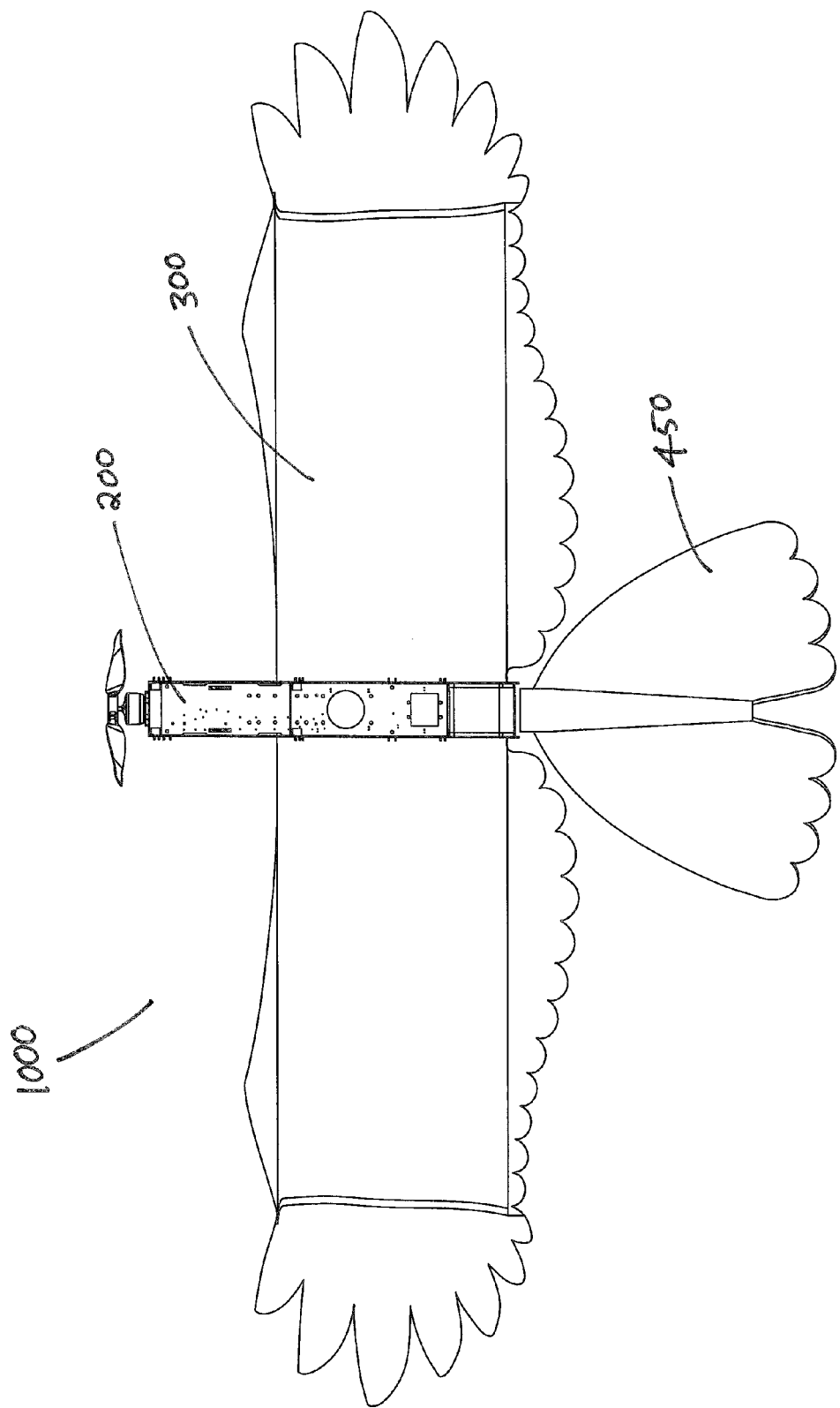
FIG. 23 is a bottom view of the UAV of FIG. 17 in accordance with an embodiment of the invention.
Figure 24:
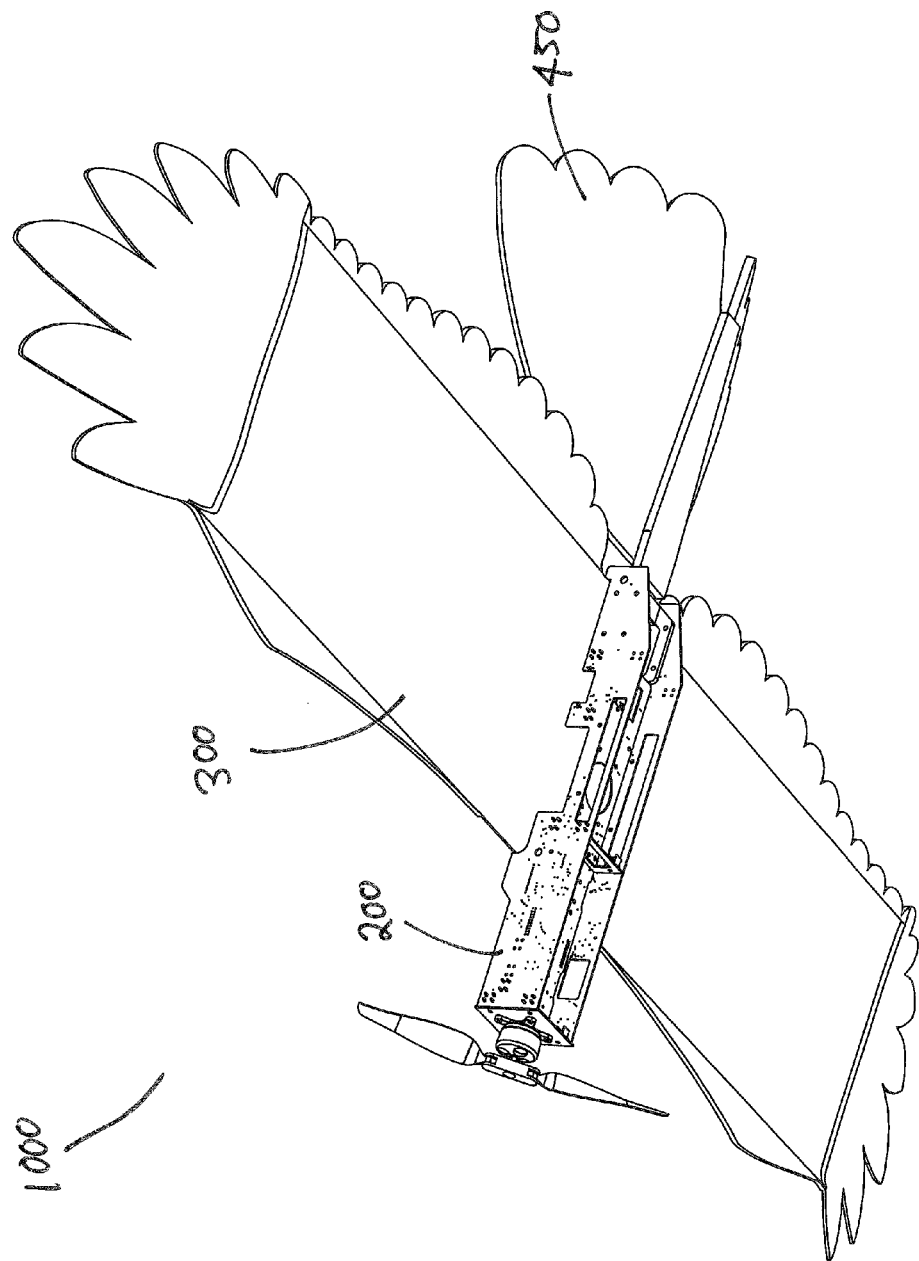
FIG. 24 is a bottom perspective view of the UAV of FIG. 17 in accordance with an embodiment of the invention.
Figure 25:
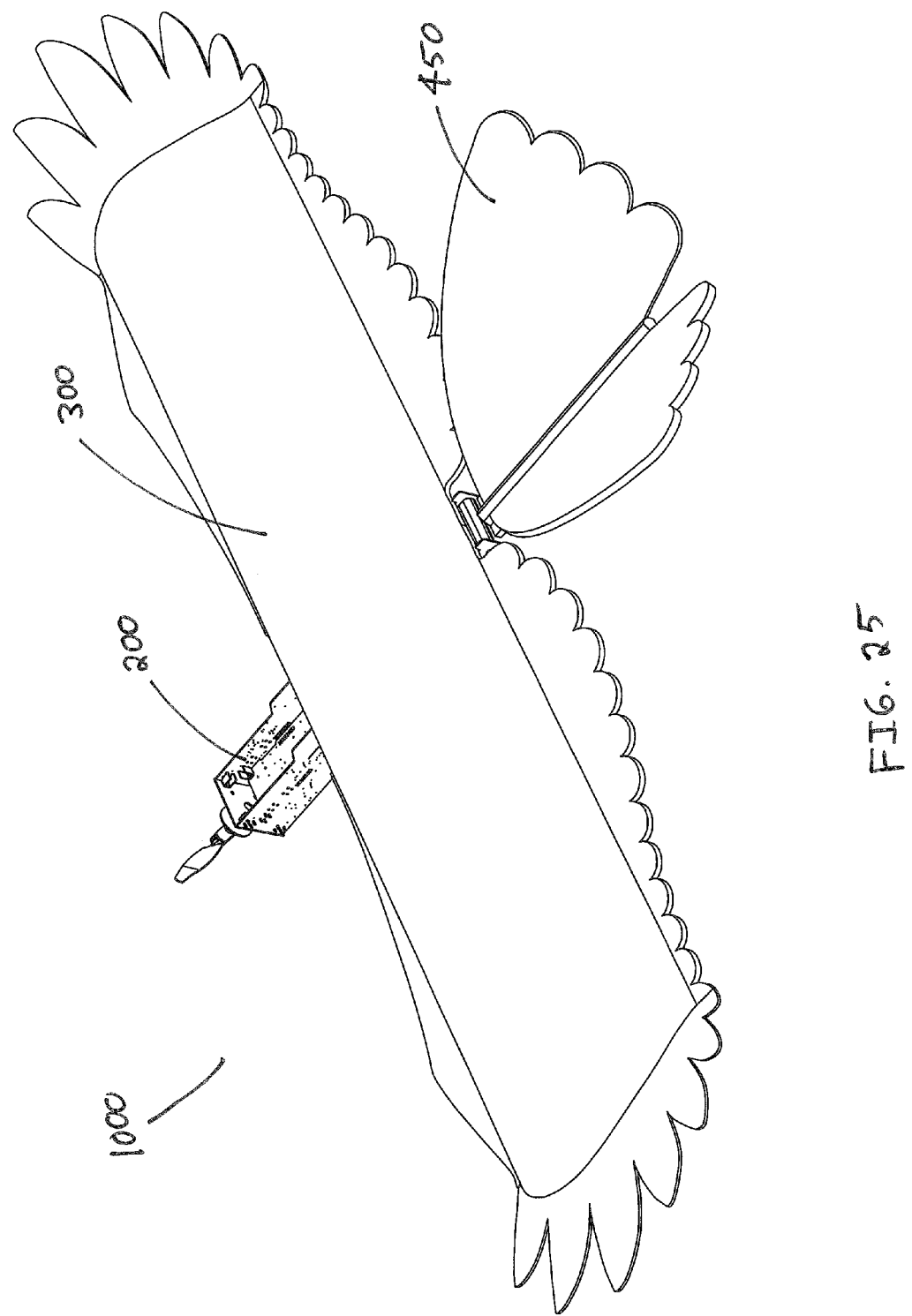
FIG. 25 is a rear perspective view of the UAV of FIG. 17 in accordance with an embodiment of the invention.
Figure 26:
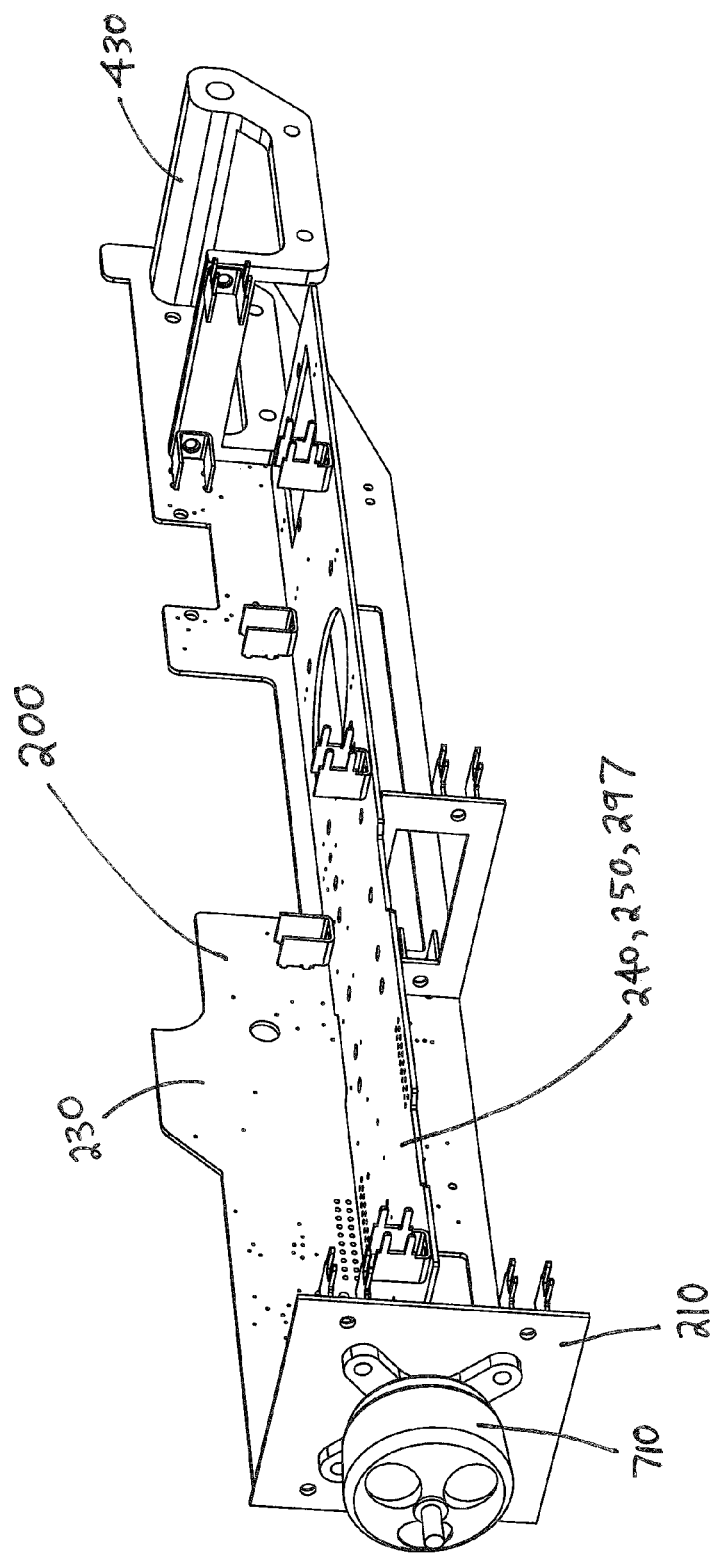
FIG. 26 is a break-away view of the fuselage of the UAV of FIG. 17 in accordance with an embodiment of the invention.

FIG. 17 is front perspective view illustrating an alternate unmanned aerial vehicle ("UAV") 1000 in accordance with an embodiment of the invention. FIG. 18 is a front view of the UAV 1000 of FIG. 17 in accordance with an embodiment of the invention. FIG. 19 is a rear view of the UAV 1000 of FIG. 17 in accordance with an embodiment of the invention. FIG. 20 is a right side view of the UAV 1000 of FIG. 17 in accordance with an embodiment of the invention. FIG. 21 is a left side view of the UAV 1000 of FIG. 17 in accordance with an embodiment of the invention. FIG. 22 is a top view of the UAV 1000 of FIG. 17 in accordance with an embodiment of the invention. FIG. 23 is a bottom view of the UAV 1000 of FIG. 17 in accordance with an embodiment of the invention. FIG. 24 is a bottom perspective view of the UAV 1000 of FIG. 17 in accordance with an embodiment of the invention. FIG. 25 is a rear perspective view of the UAV 1000 of FIG. 17 in accordance with an embodiment of the invention. And, FIG. 26 is a break-away view of the fuselage 200 of the UAV 1000 of FIG. 17 in accordance with an embodiment of the invention.

Referring to FIGS. 17-26, the alternate UAV 1000 shown therein has a single wing 300 and tail 450 which are designed to resemble those of a bird such as a hawk. The tail 450 may be connected directly to the fuselage 200. The fuselage 200 has a simplified construction and may carry a payload module internally.

Figure 27:
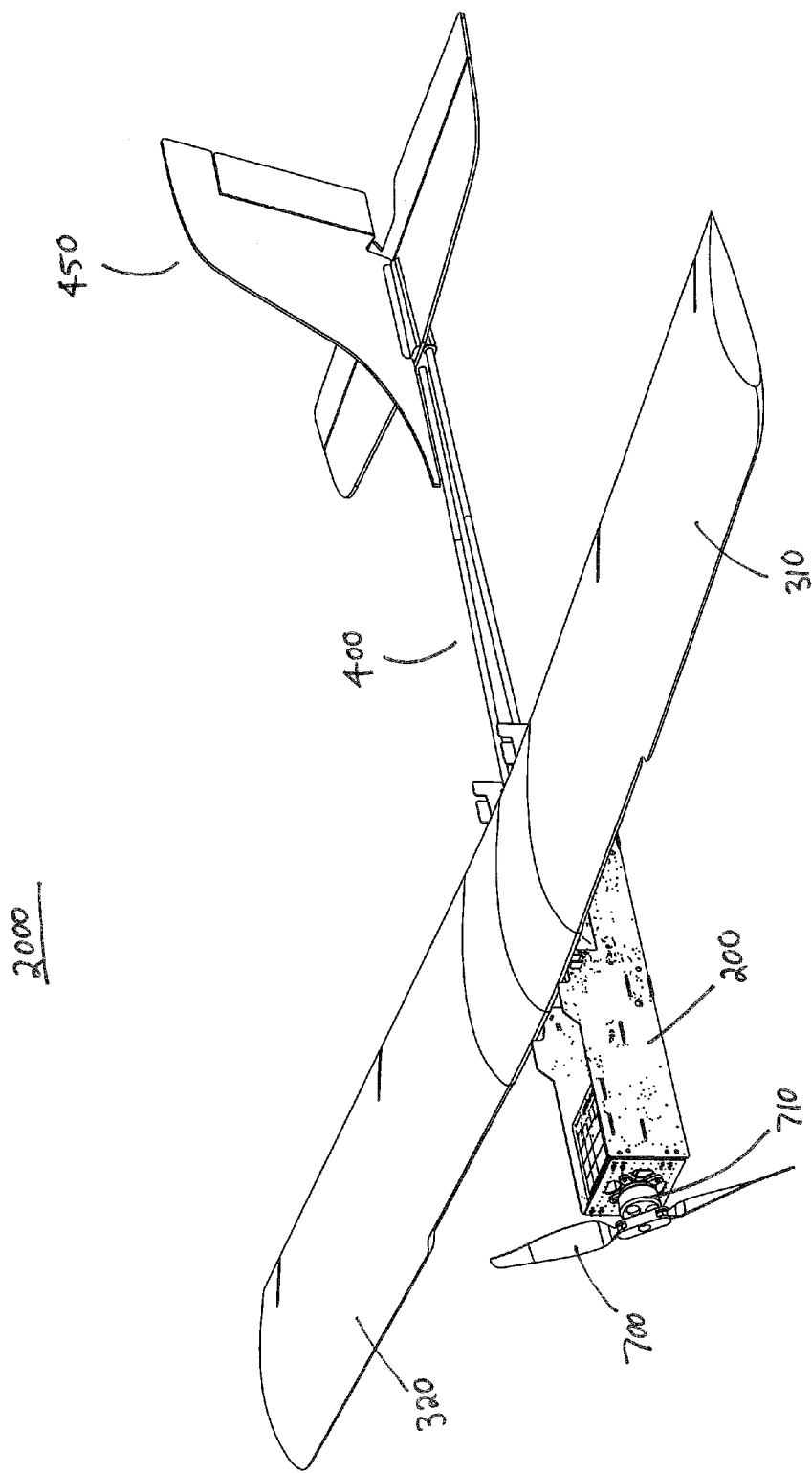
FIG. 27 is front perspective view illustrating an alternate unmanned aerial vehicle ("UAV") in accordance with an embodiment of the invention.
Figure 28:
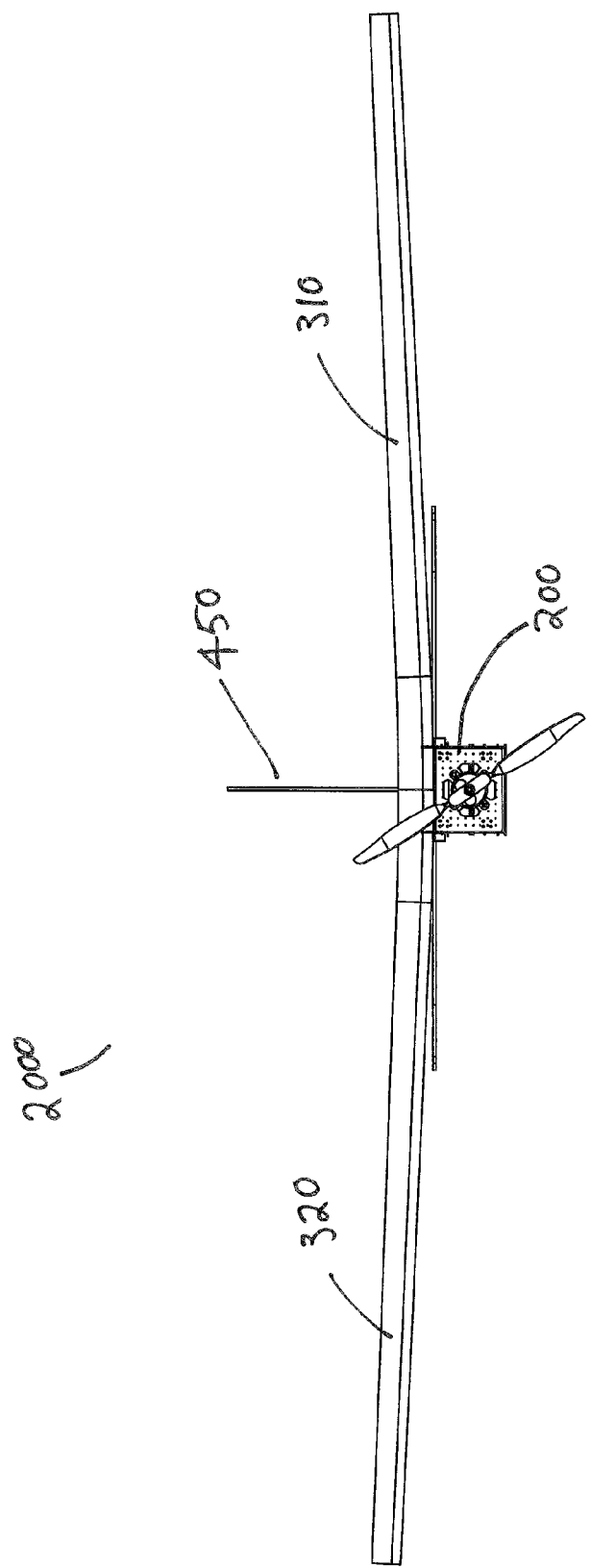
FIG. 28 is a front view of the UAV of FIG. 27 in accordance with an embodiment of the invention.
Figure 29:
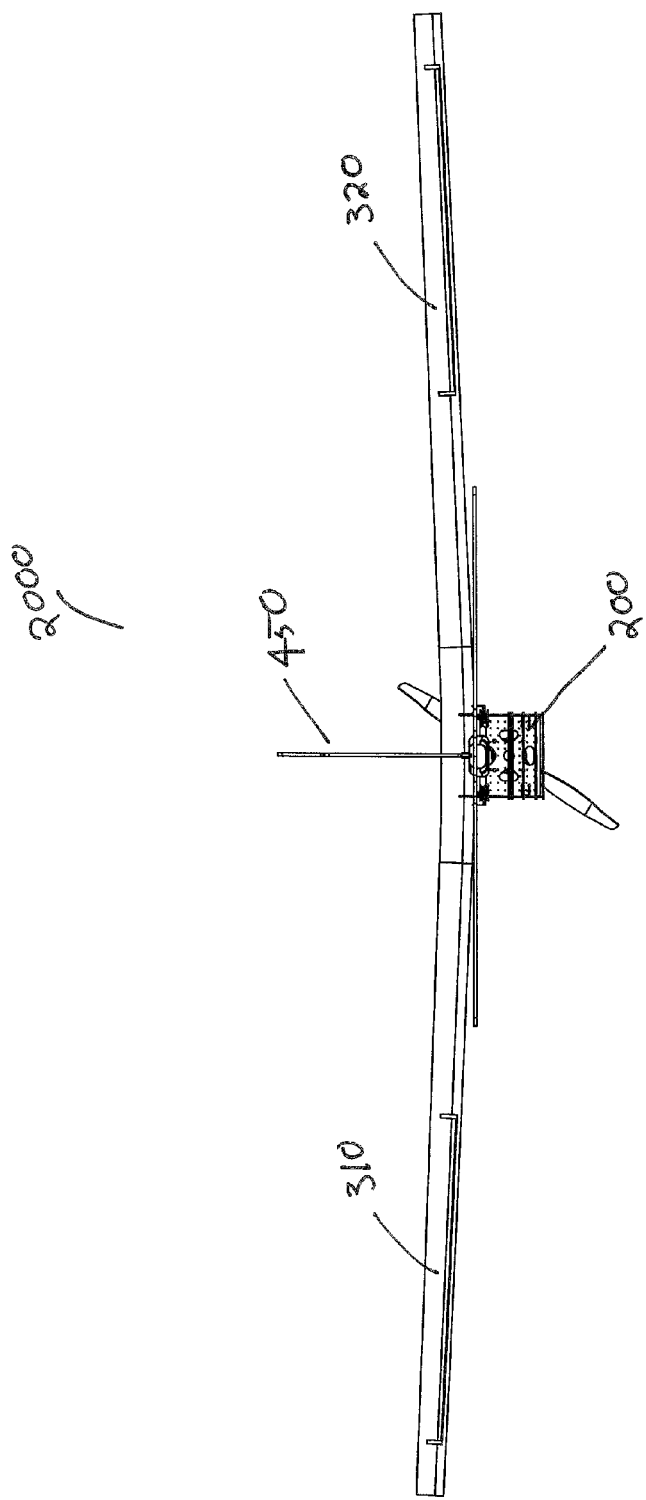
FIG. 29 is a rear view of the UAV of FIG. 27 in accordance with an embodiment of the invention.
Figure 30:
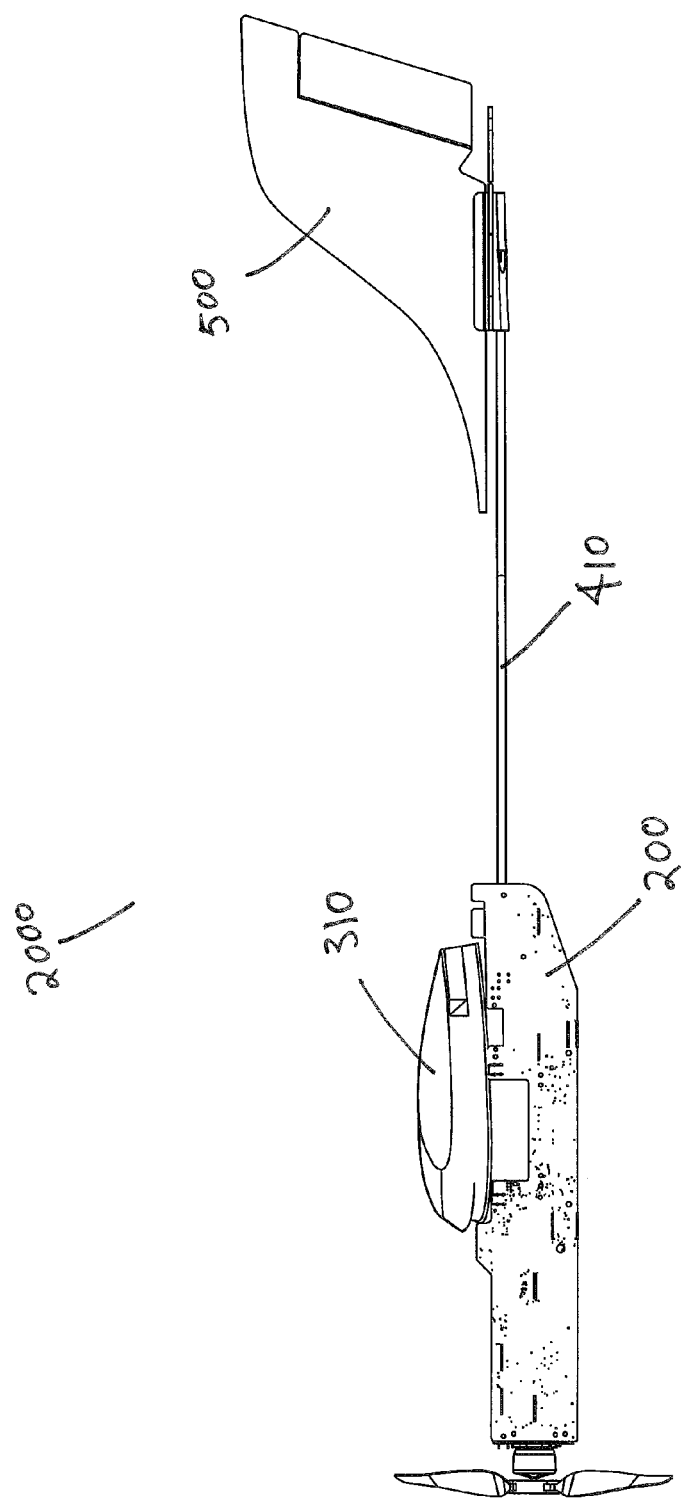
FIG. 30 is a right side view of the UAV of FIG. 27 in accordance with an embodiment of the invention.
Figure 31:
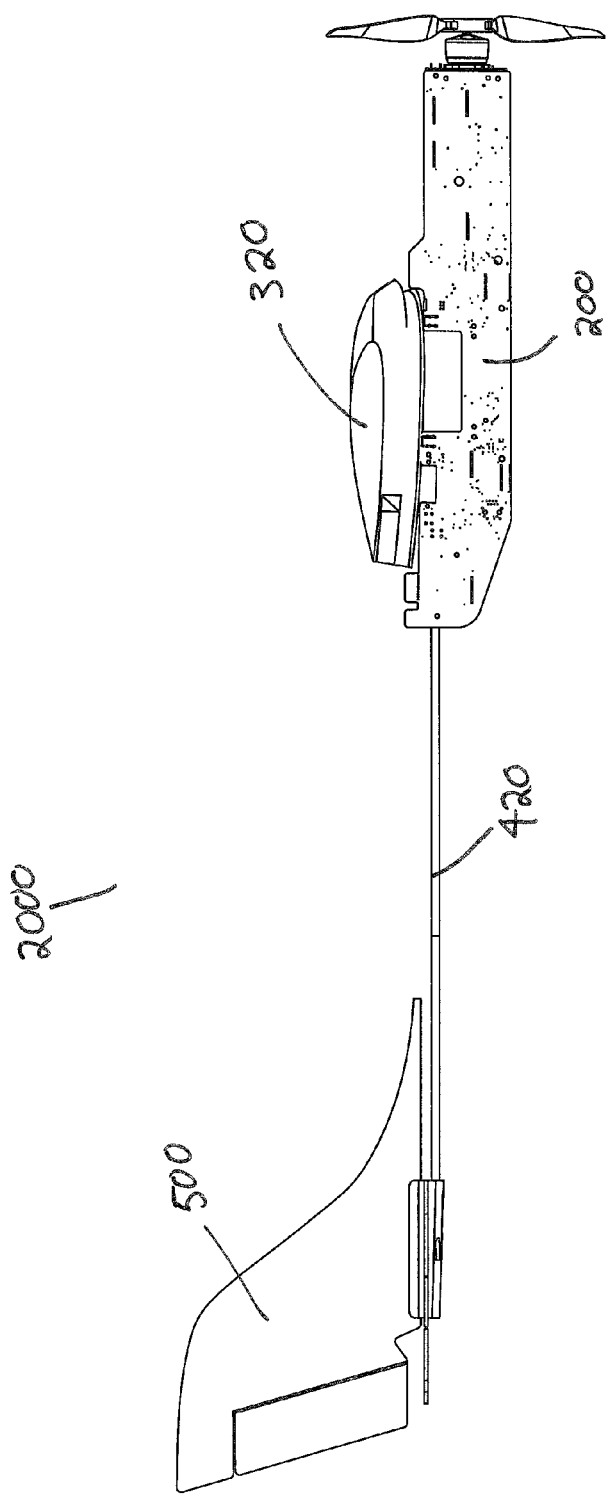
FIG. 31 is a left side view of the UAV of FIG. 27 in accordance with an embodiment of the invention.
Figure 32:
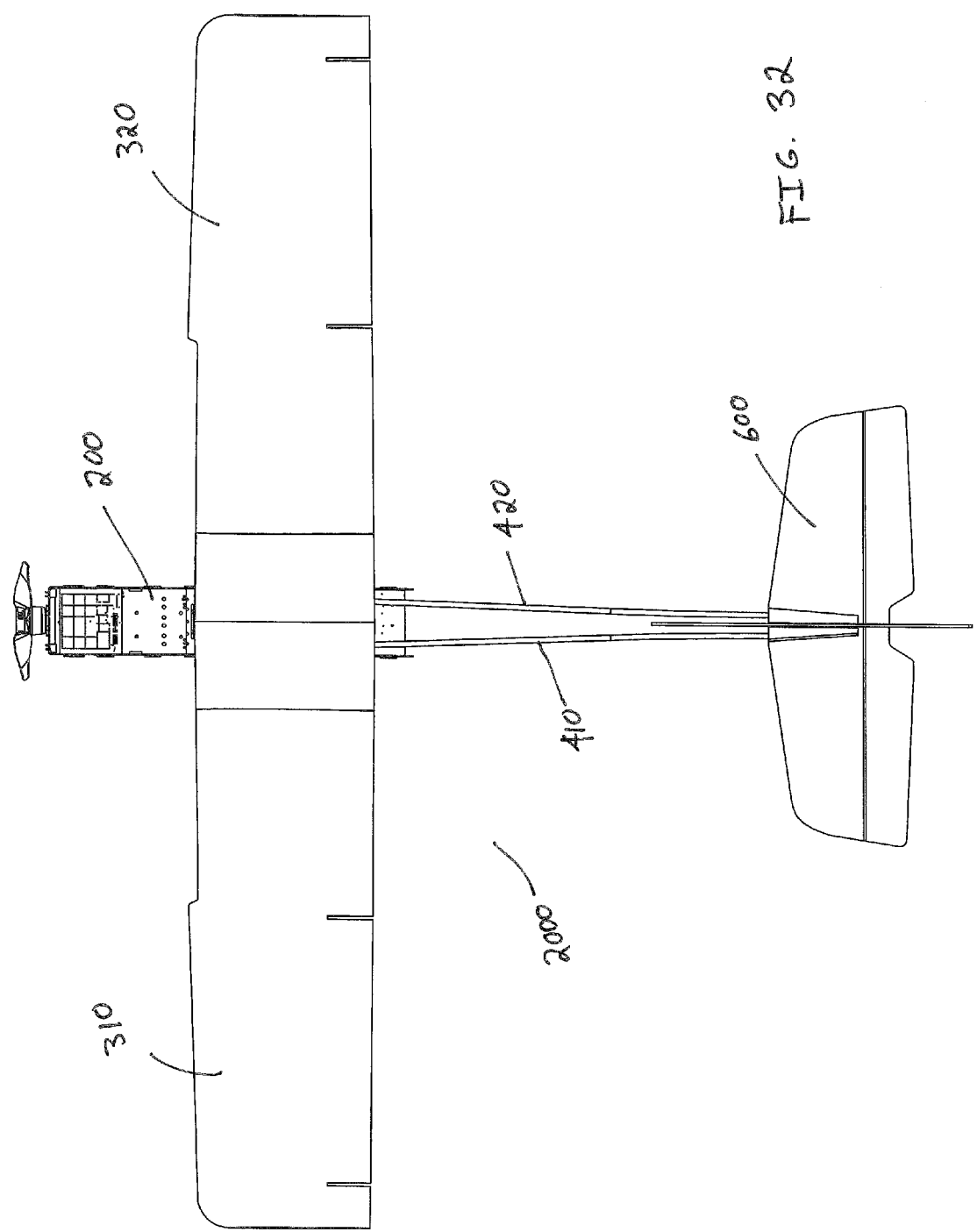
FIG. 32 is a top view of the UAV of FIG. 27 in accordance with an embodiment of the invention.
Figure 33:
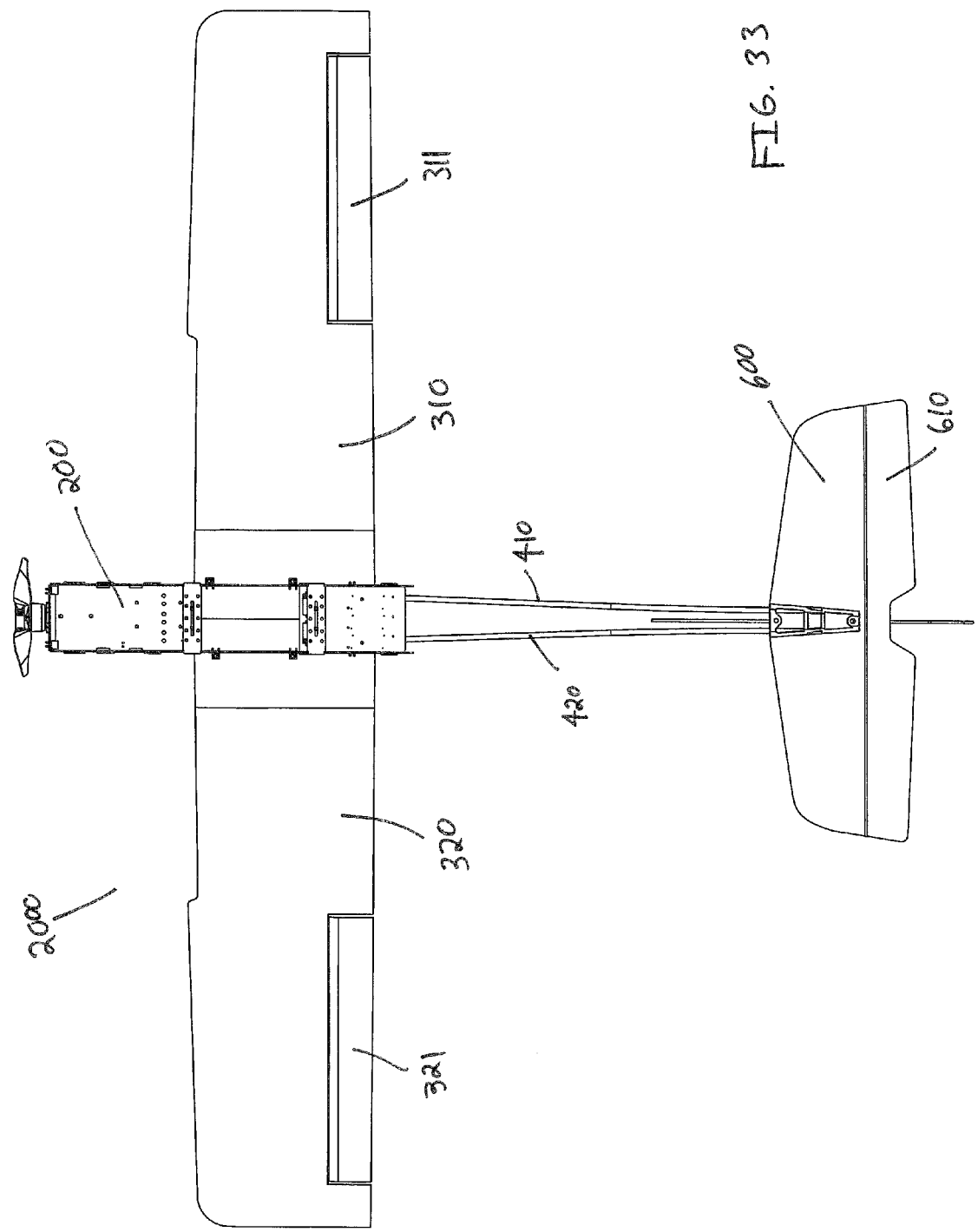
FIG. 33 is a bottom view of the UAV of FIG. 27 in accordance with an embodiment of the invention.
Figure 34:
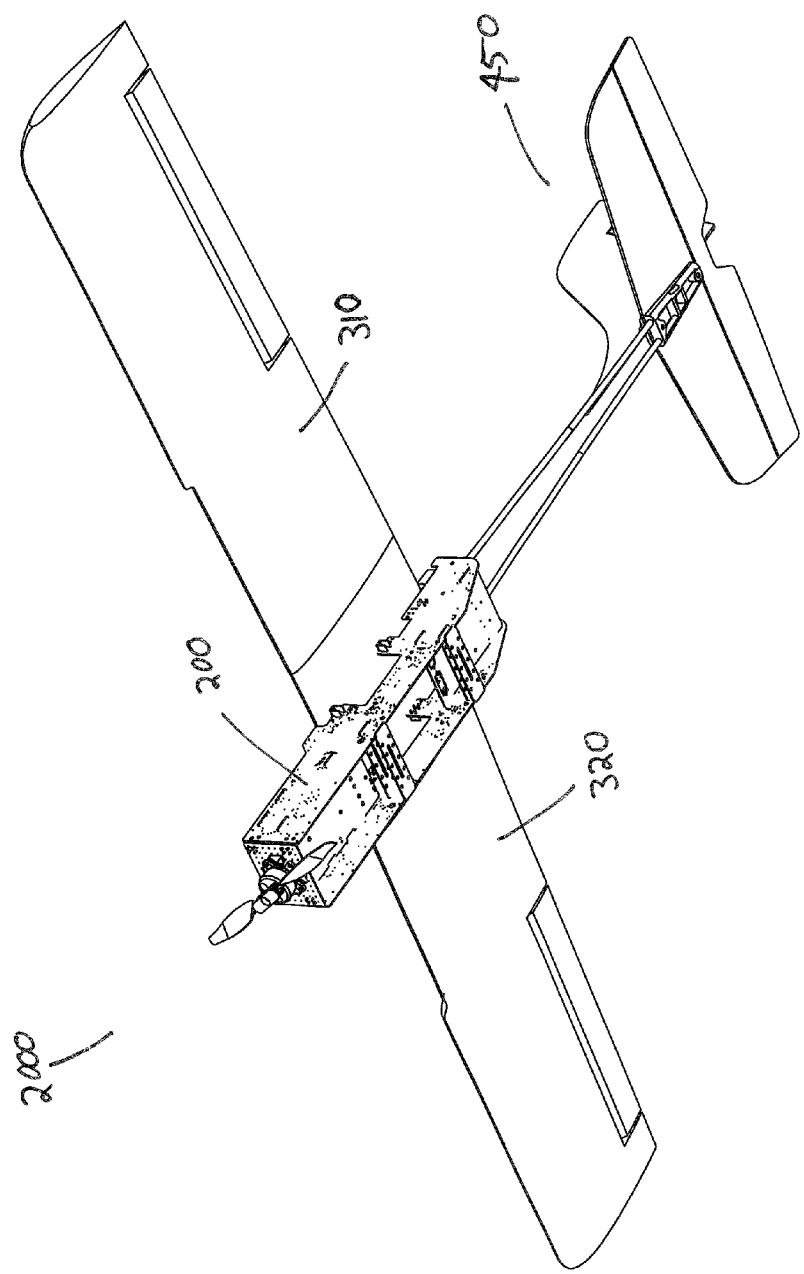
FIG. 34 is a bottom perspective view of the UAV of FIG. 27 in accordance with an embodiment of the invention.
Figure 35:
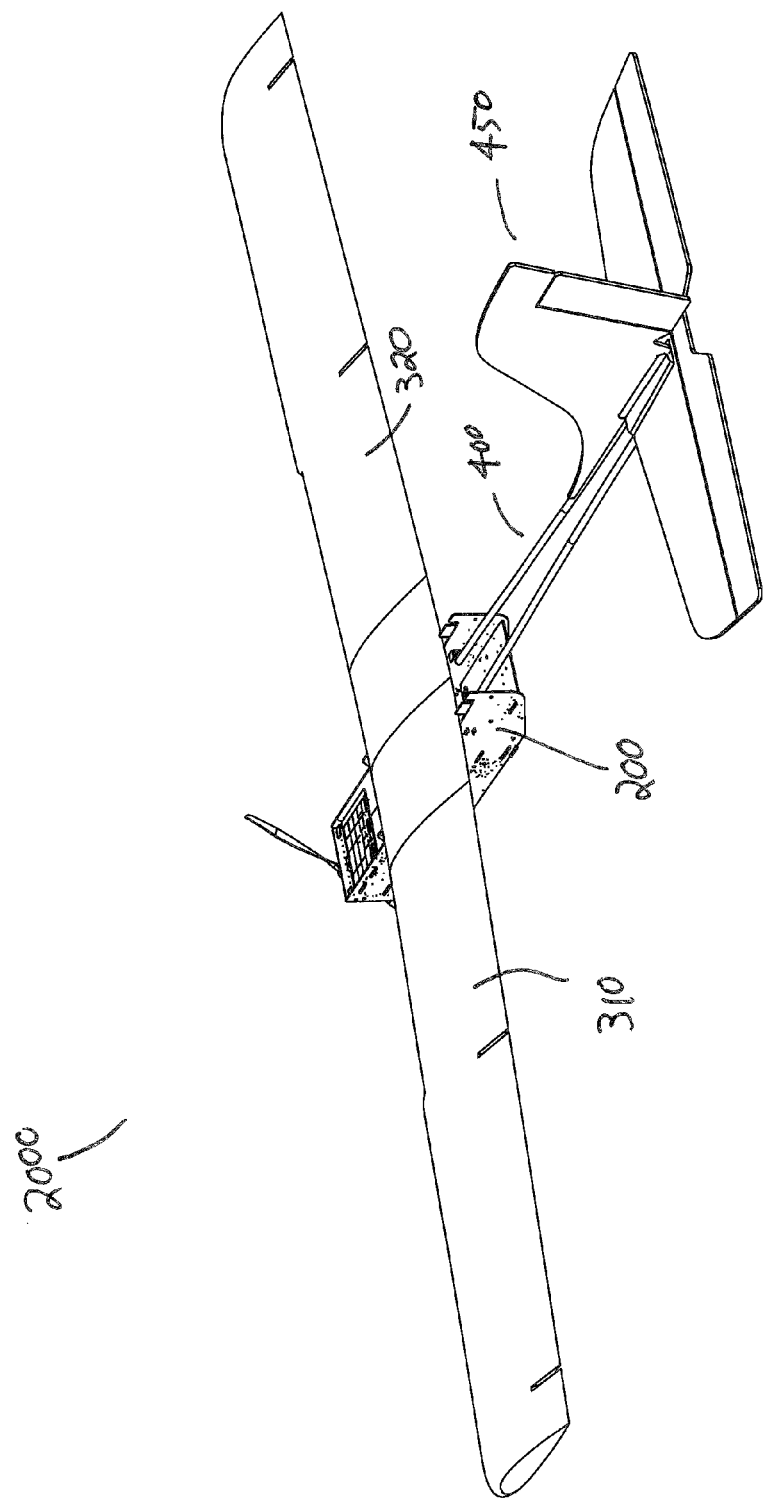
FIG. 35 is a rear perspective view of the UAV of FIG. 27 in accordance with an embodiment of the invention.
Figure 36:
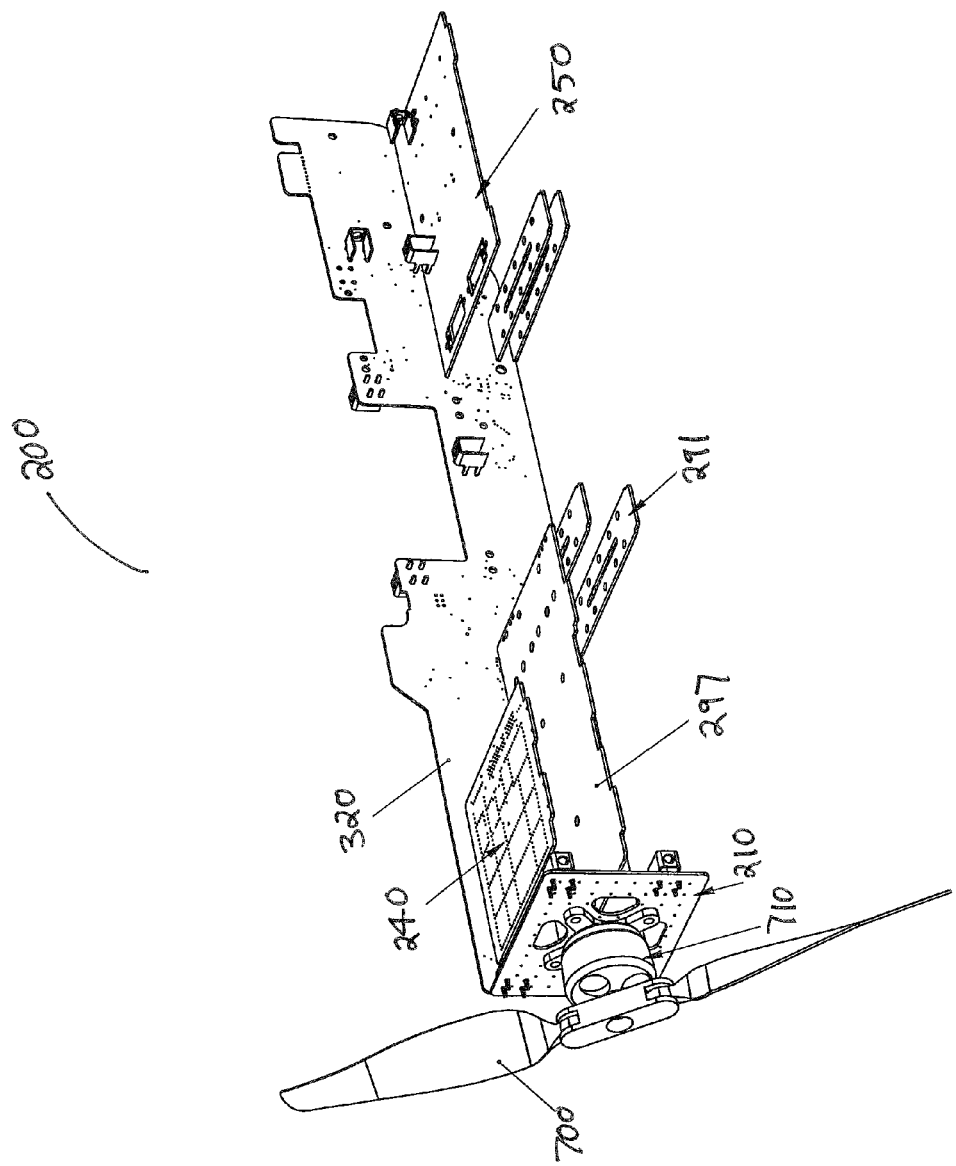
FIG. 36 is a break-away view of the fuselage of the UAV of FIG. 27 in accordance with an embodiment of the invention; and, FIG. 37 is a block diagram illustrating a distributed control system for the UAV of FIG. 1 in accordance with an embodiment of the invention.

FIG. 27 is front perspective view illustrating an alternate unmanned aerial vehicle ("UAV") 2000 in accordance with an embodiment of the invention. FIG. 28 is a front view of the UAV 2000 of FIG. 27 in accordance with an embodiment of the invention. FIG. 29 is a rear view of the UAV 2000 of FIG. 27 in accordance with an embodiment of the invention. FIG. 30 is a right side view of the UAV 2000 of FIG. 27 in accordance with an embodiment of the invention. FIG. 31 is a left side view of the UAV 2000 of FIG. 27 in accordance with an embodiment of the invention. FIG. 32 is a top view of the UAV 2000 of FIG. 27 in accordance with an embodiment of the invention. FIG. 33 is a bottom view of the UAV 2000 of FIG. 27 in accordance with an embodiment of the invention. FIG. 34 is a bottom perspective view of the UAV 2000 of FIG. 27 in accordance with an embodiment of the invention. FIG. 35 is a rear perspective view of the UAV 2000 of FIG. 27 in accordance with an embodiment of the invention. And, FIG. 36 is a break-away view of the fuselage 200 of the UAV 2000 of FIG. 27 in accordance with an embodiment of the invention.

Referring to FIGS. 27-36, the alternate UAV 2000 shown therein has two wings 310, 320 and tail 450 similar to that of the embodiment of FIGS. 1-11. The fuselage 200 has a simplified construction similar to that of the embodiment of FIGS. 17-26.

Note that the single hawk-like wing 300 and/or tail 450 of the UAV 1000 of FIGS. 17-26 may also be used on the UAV 100 of FIGS. 1-11 and/or the UAV 2000 of FIGS. 27-36. Similarly, the wings 310, 320 and/or tail 450 of the UAVs 100, 2000 of FIGS. 1-11 and/or FIGS. 27-36 may also be used on the UAV 1000 of FIGS. 17-26.

Thus, according to one embodiment, there is provided an unmanned aerial vehicle ("UAV") 100, comprising: a fuselage 200 having a first side board 220 and a second side board 230 spaced apart and connected by at least one transverse board (e.g., 297); the first side board 220, the second side board 230, and the at least one transverse board 297 being printed circuit boards; at least one of the first side board 220, the second side board 230, and the at least one transverse board 297 having formed and mounted thereon conductive traces 1630 and at least one component (e.g., 1640), respectively, for controlling and monitoring the unmanned aerial vehicle 100; first and second wings 310, 320 mounted to the fuselage 200; and, a tail 450 mounted to the fuselage 200.

The above UAV 100 may further include a conductive trace 1631 routed proximate a perimeter of at least one of the first side board 220 and the second side board 230 for detecting damage to the at least one of the first side board 220 and the second side board 230. The UAV 100 may further include a conductive trace routed proximate a connection 1400 between the at least one transverse board 297 and at least one of the first side board 220 and the second side board 230 for detecting damage to the connection 1400. The UAV 100 may further include a conductive trace routed proximate a connection between the at least one component 1640 and at least one of the first side board 220, the second side board 230, and the at least one transverse board 297 for detecting damage to at least one of the connection and the at least one component 1640. The UAV 100 may further include a propeller 700 and motor 710 for providing thrust. The motor 710 may be an electric motor. The UAV 100 may further include a battery 3710 mounted in the fuselage 200 for providing electric power to the electric motor 710 and to the at least one component 1640. The first side board 220 and the second side board 230 may be vertical and parallel and the at least one transverse board 297 may be horizontal. The at least one component may include a processor 1640. The UAV 100 may further include a payload bay 201 formed proximate bottom edges of the first side board 220 and the second side board 230, the payload bay 201 for mounting a payload module. At least one of the first side board 220 and the second side board 230 may be provided with at least one conductive trace 1200 for receiving an electrical connector of the payload module. The payload module may be a camera. The wings 310, 320 may be detachable. The at least one component may include at least one sensor 1650. The UAV 100 may further include at least one boom 400 for mounting the tail 450 to the fuselage 200. The tail 450 may include a horizontal stabiliser 600 and a vertical stabiliser 500. The at least one component may include at least one servo motor 271, 272 for adjusting flight control surfaces 610, 510 of the horizontal stabiliser 600 and the vertical stabiliser 500. The UAV 100 may further include at least one opening 211 formed in a nose (e.g., 210) of the fuselage 200 to allow air to pass therethrough to cool the at least one component 1640. And, the first side board 220 and the second side board 230 may be elongate and may be tapered toward fore and aft of the fuselage 200.

The above embodiments may contribute to an improved unmanned aerial vehicle ("UAV") 100 and may provide one or more advantages. First, the UAV 100 reduces or eliminates the need for trained unmanned aircraft operators on the ground and allows civilian users (e.g., farmers, etc.) to collect high quality remote sensing data. Second, the UAV 100 is easy to use having intelligent systems and generating flight planning, diagnostics, and flight control information on board. Third, the UAV 100 has an improved diagnostic and control system 3700 which is used to sense damage and fatigue, respond to unsafe wind and weather conditions, and recognise incompatible commands from a user. The diagnostic and control system 3700 may include temperature and mechanical sensing of the airframe itself as well as critical components such as the motor, speed control devices, etc. The ability to recognise failures at key structural areas allows the UAV 100 to land and/or prevent flight prior to catastrophic failure of a component of the UAV 100 or the UAV 100 itself. Fourth, the UAV 100 may be made at reduced cost, is robust with improved reliability, and is scalable from a manufacturing perspective. Fifth, improved computational resources and redundant systems may also be included within a small footprint on board the UAV 100 and with as little additional weight as possible. Sixth, the use of PCB circuit-as-structure construction allows for: mechanical sensing embodied in the airframe itself; reduction in wiring for lighter weight; and, enables the placement of electronics, computers, and sensors anywhere in the UAV 100 to support required functions and capabilities. PCB materials are very rugged, robust, and allow for rapid and readily available manufacturing at large scale. Seventh, the structure of the UAV 100 allows for complex electronic capabilities including sensor, power distribution, and computation to be readily placed at the point of need in the UAV 100, implemented with minimal weight, and without the need for large, bulky, heavy and expensive wiring harnesses. Eighth, the UAV 100 is strong, rigid, and light weight. Ninth, the UAV 100 is inexpensive and fast to make by using well established manufacturing technologies that allow for production to be easily and rapidly scaled. And, tenth, the PCB-based structure allows for a light, strong, inexpensive, yet very complex UAV 100 to be rapidly manufactured and deployed.

The embodiments of the invention described above are intended to be exemplary only. Those skilled in this art will understand that various modifications of detail may be made to these embodiments, all of which come within the scope of the invention.

What is claimed is:

1. An unmanned aerial vehicle, comprising:
a fuselage having a first side board and a second side board spaced apart and connected by at least one transverse board; the first side board, the second side board, and the at least one transverse board being printed circuit boards; at least one of the first side board, the second side board, and the at least one transverse board having formed and mounted thereon conductive traces and at least one component, respectively, for controlling and monitoring the unmanned aerial vehicle;
first and second wings mounted to the fuselage; and,
a tail mounted to the fuselage.

2. The unmanned aerial vehicle of claim 1, further comprising a conductive trace routed proximate a perimeter of at least one of the first side board and the second side board for detecting damage to the at least one of the first side board and the second side board.

3. The unmanned aerial vehicle of claim 1, further comprising a conductive trace routed proximate a connection between the at least one transverse board and at least one of the first side board and the second side board for detecting damage to the connection.

4. The unmanned aerial vehicle of claim 1, further comprising a conductive trace routed proximate a connection between the at least one component and at least one of the first side board, the second side board, and the at least one transverse board for detecting damage to at least one of the connection and the at least one component.

5. The unmanned aerial vehicle of claim 1, further comprising a propeller and motor for providing thrust.

6. The unmanned aerial vehicle of claim 5, wherein the motor is an electric motor.

7. The unmanned aerial vehicle of claim 6, further comprising a battery mounted in the fuselage for providing electric power to the electric motor and to the at least one component.

8. The unmanned aerial vehicle of claim 1, wherein the first side board and the second side board are vertical and parallel and the at least one transverse board is horizontal.

9. The unmanned aerial vehicle of claim 1, wherein the at least one component includes a processor.

10. The unmanned aerial vehicle of claim 1, further comprising a payload bay formed proximate bottom edges of the first side board and the second side board, the payload bay for mounting a payload module.

11. The unmanned aerial vehicle of claim 10, wherein at least one of the first side board and the second side board is provided with at least one conductive trace for receiving an electrical connector of the payload module.

12. The unmanned aerial vehicle of claim 10, wherein the payload module is a camera.

13. The unmanned aerial vehicle of claim 1, wherein the wings are detachable.

14. The unmanned aerial vehicle of claim 1, wherein the at least one component includes at least one sensor.

15. The unmanned aerial vehicle of claim 1, further comprising at least one boom for mounting the tail to the fuselage.

16. The unmanned aerial vehicle of claim 1, wherein the tail includes a horizontal stabiliser and a vertical stabiliser.

17. The unmanned aerial vehicle of claim 16, wherein the at least one component includes at least one servo motor for adjusting flight control surfaces of the horizontal stabiliser and the vertical stabiliser.

18. The unmanned aerial vehicle of claim 1, further comprising at least one opening formed in a nose of the fuselage to allow air to pass therethrough to cool the at least one component.

19. The unmanned aerial vehicle of claim 1, wherein the first side and the second side are elongate and are tapered toward fore and aft of the fuselage.

20. A method for forming an unmanned aerial vehicle, comprising:
assembling a fuselage having a first side board and a second side board spaced apart and connected by at least one transverse board; the first side board, the second side board, and the at least one transverse board being printed circuit boards; at least one of the first side board, the second side board, and the at least one transverse board having formed and mounted thereon conductive traces and at least one component, respectively, for controlling and monitoring the unmanned aerial vehicle;
mounting first and second wings to the fuselage; and,
mounting a tail to the fuselage.

21. A fuselage for an unmanned aerial vehicle, comprising:
a first side board and a second side board spaced apart and connected by at least one transverse board;
wherein the first side board, the second side board, and the at least one transverse board are printed circuit boards; and,
wherein at least one of the first side board, the second side board, and the at least one transverse board has formed and mounted thereon conductive traces and at least one component, respectively, for controlling and monitoring the unmanned aerial vehicle.

* * * * *